United States Patent
Chen et al.

(10) Patent No.: US 11,251,244 B2
(45) Date of Patent: Feb. 15, 2022

(54) LIGHT-EMITTING DEVICE

(71) Applicant: INT TECH CO., LTD., Hsinchu County (TW)

(72) Inventors: Huei-Siou Chen, Taipei (TW); Li-Chen Wei, Taichung (TW)

(73) Assignee: INT TECH CO., LTD., Hsinchu County (TW)

( * ) Notice: Subject to any disclaimer, the term of this patent is extended or adjusted under 35 U.S.C. 154(b) by 150 days.

(21) Appl. No.: 16/748,520

(22) Filed: Jan. 21, 2020

(65) Prior Publication Data

US 2020/0161396 A1 May 21, 2020

Related U.S. Application Data

(63) Continuation-in-part of application No. 15/995,472, filed on Jun. 1, 2018, now Pat. No. 10,581,011.

(51) Int. Cl.
*H01L 27/32* (2006.01)
*H01L 51/50* (2006.01)
*H01L 51/52* (2006.01)

(52) U.S. Cl.
CPC ...... *H01L 27/3246* (2013.01); *H01L 51/5056* (2013.01); *H01L 51/5064* (2013.01);
(Continued)

(58) Field of Classification Search
None
See application file for complete search history.

(56) References Cited

U.S. PATENT DOCUMENTS 6,366,017 B1 * 4/2002 Antoniadis ......... H01L 51/5203
313/113
2016/0284776 A1 * 9/2016 Kim ...................... H01L 27/326
(Continued)

FOREIGN PATENT DOCUMENTS

CN 101543135 A 9/2009
CN 102820318 A 12/2012
(Continued)

OTHER PUBLICATIONS

Office Action, Cited References and Search Report dated May 6, 2021 issued by the China National Intellectual Property Administration (CNIPA) for Chinese counterpart application No. 201811344767.0.
(Continued)

*Primary Examiner* — Andres Munoz
(74) *Attorney, Agent, or Firm* — WPAT, P.C., Intellectual Property Attorneys; Anthony King

(57) ABSTRACT

A light-emitting device includes a substrate, a plurality of bumps over the substrate; and a plurality of light-emitting units separated by the bumps. Each of the light-emitting units includes a first electrode on the substrate, an organic layer on the first electrode, and a second electrode on the organic layer. The light-emitting units comprise a first light-emitting unit and a second light-emitting unit, and the first light-emitting unit further includes an intermediate layer between the organic layer and the second electrode. The organic layer of the first light-emitting unit includes a first material, the second electrodes of the first light-emitting unit and the second light-emitting unit include an electrode material, and the intermediate layer of the first light-emitting unit includes the first material and the electrode material.

16 Claims, 21 Drawing Sheets

(52) U.S. Cl.
CPC ...... *H01L 51/5072* (2013.01); *H01L 51/5203* (2013.01); *H01L 2251/558* (2013.01)

(56) References Cited

U.S. PATENT DOCUMENTS

2018/0294426 A1* 10/2018 Chen .................. H01L 51/5056
2019/0019851 A1* 1/2019 Chen .................. H01L 51/5088
2020/0020872 A1* 1/2020 Chen .................. H01L 51/5203

FOREIGN PATENT DOCUMENTS

| | | |
|---|---|---|
| CN | 106024827 A | 10/2016 |
| JP | 2007-317606 | 12/2007 |
| KR | 10-2007-0050330 | 5/2007 |
| KR | 10-2009-0028513 | 3/2009 |
| KR | 10-2016-0114754 | 10/2016 |

OTHER PUBLICATIONS

English Abstract of CN101543135.
English Abstract of CN106024827.
English Abstract of CN102820318.
Final Office Action from the Korean Intellectual Property Office of Korean patent application No. 10-2018-0115705 dated Mar. 27, 2020.

* cited by examiner

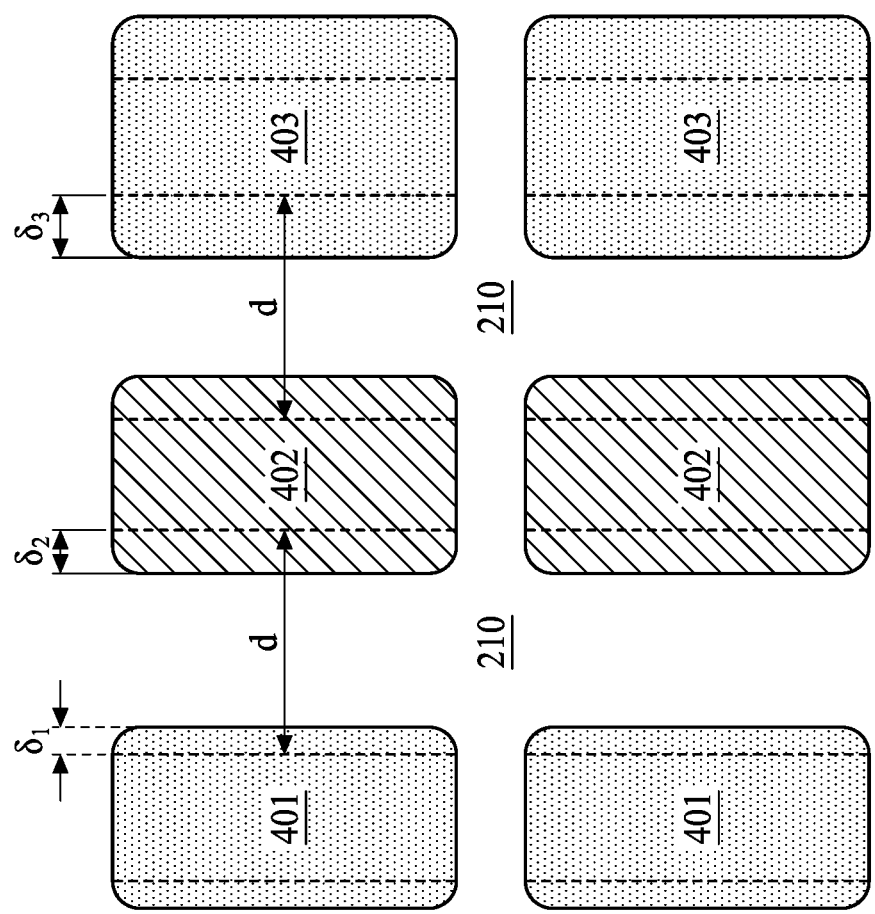

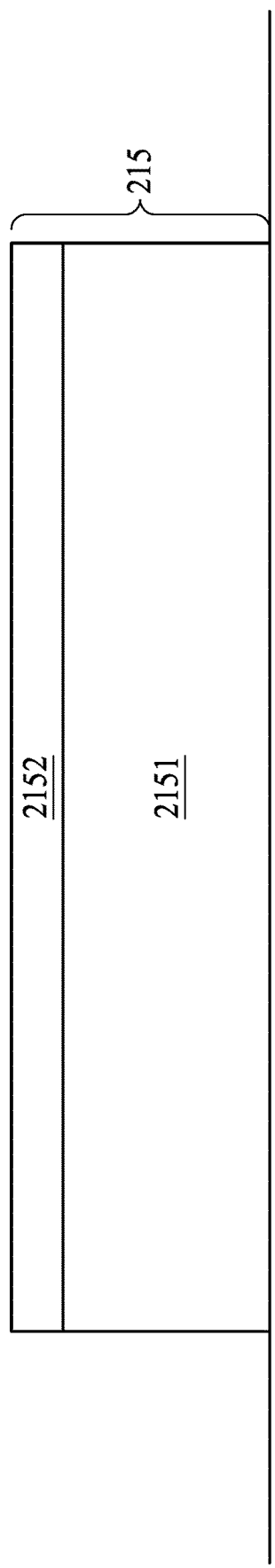

LIGHT-EMITTING DEVICE

CROSS-REFERENCE TO RELATED APPLICATIONS

This application is a continuation-in-part application of a U.S. patent application entitled LIGHT-EMITTING DEVICE, Ser. No. 15/995,472, filed Jun. 1, 2018.

TECHNICAL FIELD

The present disclosure is related to a light-emitting device, and especially to an organic light-emitting device.

BACKGROUND

Organic light-emitting display has been used widely in many high-end electronic devices. However, due to the constraints of current technology, in which the pixel definition is realized by coating a light-emitting material on a substrate through a mask, the critical dimension on the mask often cannot be smaller than 100 microns. Therefore, achieving pixel density of 800 ppi or greater becomes a difficult task for a display manufacturer.

SUMMARY

In the present disclosure, light-emitting units are formed using a photosensitive material. The photosensitive material is disposed directly on a substrate through a mask. The pixel definition is realized by a photolithography process.

According to an embodiment of the present disclosure, a light-emitting device includes a substrate, a plurality of bumps over the substrate, and a plurality of light-emitting units separated by the bumps. Each of the light-emitting units includes a first electrode on the substrate, an organic layer on the first electrode, and a second electrode on the organic layer, wherein the light-emitting units comprise a first light-emitting unit and a second light-emitting unit, and the first light-emitting unit further includes an intermediate layer between the organic layer and the second electrode. The organic layer of the first light-emitting unit includes a first material, the second electrodes of the first light-emitting unit and the second light-emitting unit include an electrode material, and the intermediate layer of the first light-emitting unit includes the first material and the electrode material.

According to another embodiment of the present disclosure, a light-emitting device includes a substrate; a plurality of bumps over the substrate; and a first light-emitting unit and a second light-emitting unit between the bumps and over the substrate. Each of the first and second light-emitting units includes a first electrode, an organic layer over the first electrode, and a second electrode over the organic layer. A thickness of the organic layer of the first light-emitting unit is less than a thickness of the organic layer of the second light-emitting unit, and a wavelength of a light emitted from the first light-emitting unit is greater than a wavelength of a light emitted from the second light-emitting unit.

According to another embodiment of the present disclosure, a light-emitting device includes a substrate and a plurality of light-emitting units over the substrate. Each of the light-emitting units includes a first electrode, a first hole transportation layer over the first electrode, a second hole transportation layer over a portion of the first hole transportation layer, and an organic emissive layer over the second hole transportation layer. The second hole transportation layer includes a central region and a peripheral region surrounding the central region, wherein a portion of the first hole transportation layer overlapped by the peripheral region of the second hole transportation layer has a thickness greater than a thickness of a portion of the first hole transportation layer overlapped by the central region of the second hole transportation layer.

BRIEF DESCRIPTION OF THE DRAWINGS

FIG. 4B is a top view of a portion of a light-emitting layer having several light-emitting pixels, according to an embodiment.

FIG. 6A is a cross-sectional view of an electrode, according to an embodiment.

DETAILED DESCRIPTION OF THE DISCLOSURE

Figure 1:
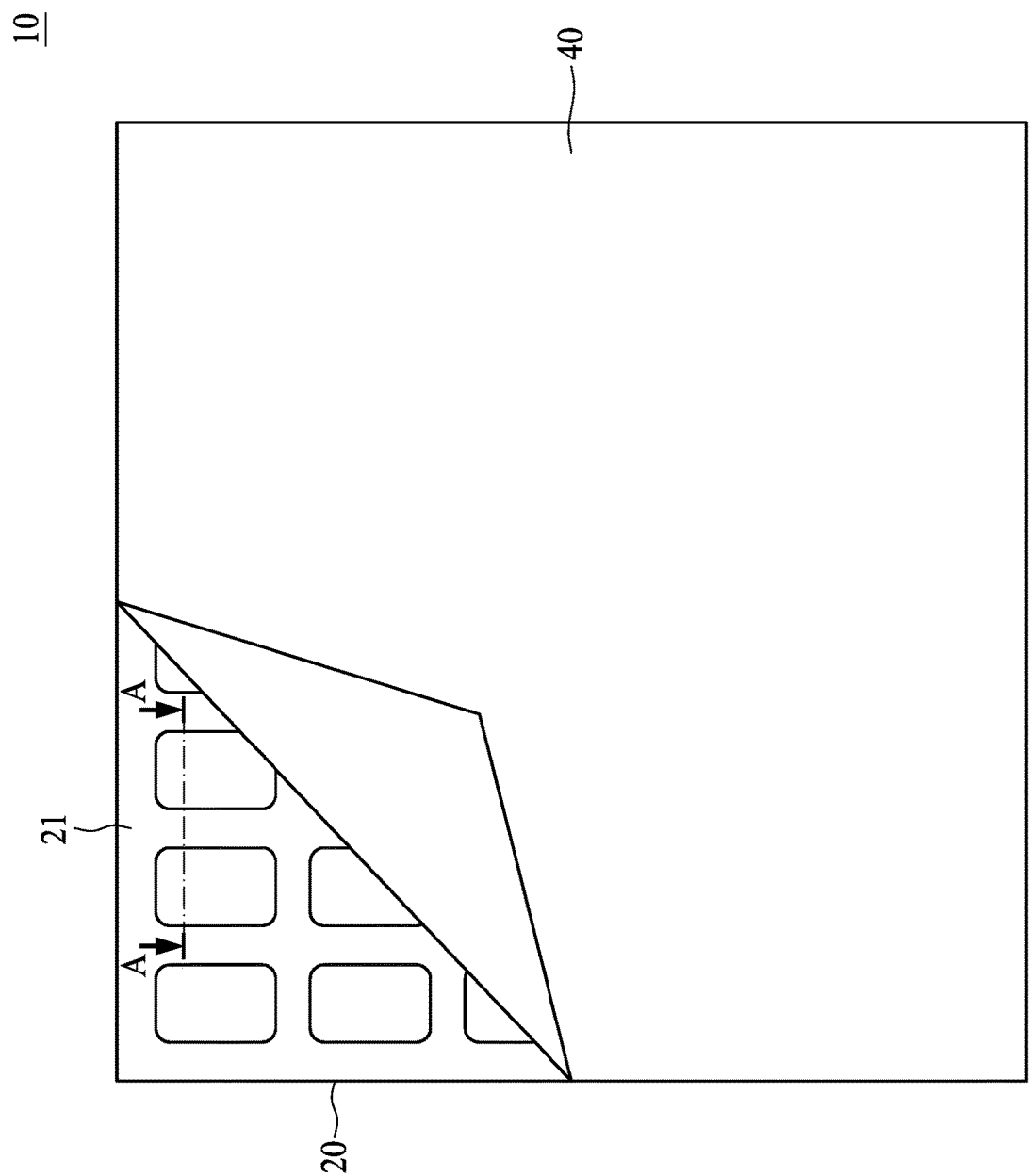
FIG. 1 is a top view illustrating an intermediate product of a light-emitting device.

FIG. 1 is a top view illustrating an intermediate product of a light-emitting device 10. The light-emitting device 10 has a light-emitting layer 20 and a cap layer 40 over the light-emitting layer 20. For the light-emitting layer 20, a spacer 21 can be designed to provide an array of recesses for accommodating an array of light-emitting pixels. In some embodiments, the spacer 21 may include a photosensitive material.

Figure 2A:
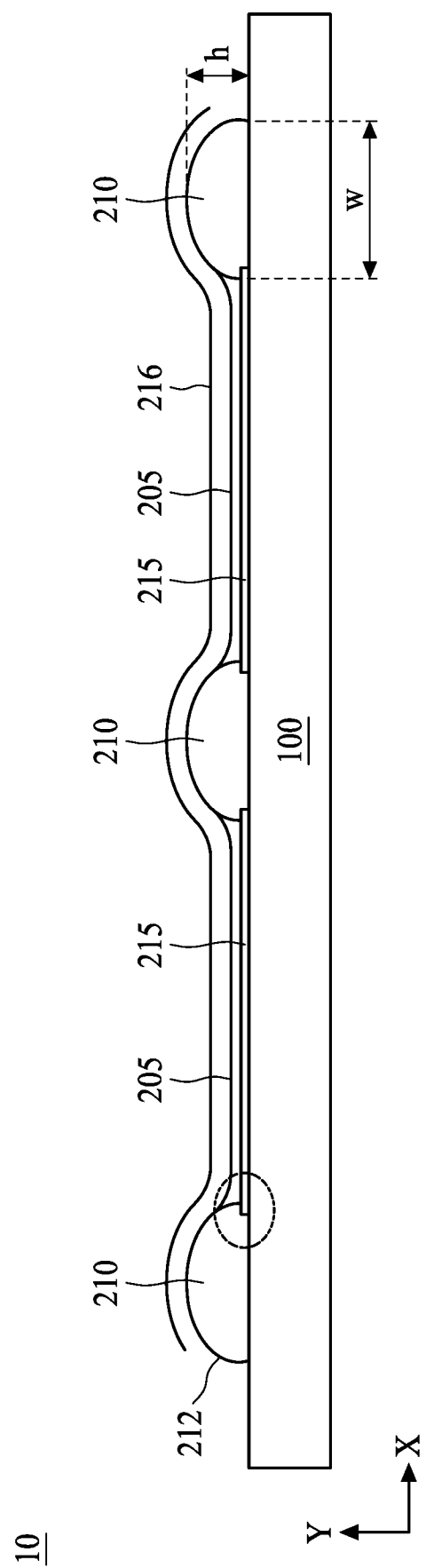
FIG. 2A is a cross-sectional view along line AA in FIG. 1.

FIG. 2A is a cross-sectional view along line AA in FIG. 1 and illustrates only the light-emitting area. The cap layer 40 is omitted herein for simplicity. The spacer 21 has several bumps 210 to define the light-emitting pixel pattern. A recess is between two adjacent bumps 210 and provides the space to accommodate a light-emitting pixel. Persons having ordinary skill in the art should appreciate that the bumps 210 are shown in a disconnected manner in the cross-sectional view, but the bumps may be connected to each other through other portions of the spacer 21 from the top view perspective as shown in FIG. 1.

A substrate 100 is under the light-emitting layer 20. In some embodiments, the substrate may include a transistor array that is arranged corresponding to the light-emitting pixels in the light-emitting layer 20. The substrate 100 may include several capacitors. In some embodiments, multiple transistors are configured to form a circuit with one capacitor and one light-emitting pixel.

In some embodiments, the substrate 100 is a stack including at least three different layers. The substrate 100 may include an inorganic dielectric layer at the bottom and a metallic layer on the inorganic dielectric layer. Another inorganic dielectric layer is disposed over the metallic layer. Thus, the metallic layer is sandwiched between two inorganic dielectric layers. In some embodiments, the inorganic dielectric layer can be replaced by an organic dielectric layer with a bending radius less than about 100 μm. In some embodiments, the inorganic dielectric layer has a thickness between about 400 μm and about 1200 μm. The metallic layer has a thickness between about 100 μm and about 400 μm. In some embodiments, the substrate 100 includes two polymeric layers and an inorganic layer between the two polymeric layers.

In some embodiments, the substrate 100 includes two polymeric layers and a metallic layer therebetween. In some embodiments, the substrate 100 has two polymeric layers and an inorganic layer therebetween. The inorganic layer can be oxide or nitride. In some embodiments, the inorganic layer includes silicon oxide, silicon nitride, or aluminum oxide. In some embodiments, the inorganic layer has greater water resistance than the polymeric layer. In some embodiments, at least one side (along the film-stacking direction) of the polymeric layer is coated with an inorganic layer. In some embodiments, the polymeric layer has a thickness between about 1 μm and about 5 μm. In some embodiments, the substrate 100 is partially formed by a black material. The black material can absorb the visible light in order to reduce the reflection.

A light-emitting pixel has a first electrode 215 over the substrate 100. In some embodiments, the first electrode is the anode of the light-emitting pixel. The first electrode 215 is partially covered by the spacer 21. As shown in FIG. 2A, the peripheral region of the first electrode 215 is covered by bumps 210. In some embodiments, the edge corner of the first electrode 215 is entirely enclosed by the spacer bump 210. In some embodiments, the sidewall of the first electrode 215 is entirely in contact with the spacer bump 210.

The first electrode 215 may have a total thickness between about 1500 Å and about 2700 Å. In some embodiments, the first electrode 215 has a total thickness between about 1800 Å and about 2200 Å. In some embodiments, the first electrode 215 has a total thickness of about 2000 Å. The first electrode 215 may include ITO, IZO, AlCu alloy, AgMo Alloy, about 50 Å to 500 Å ITO (or IZO), about 500 Å to 2000 Å metallic film (Ag, Al, Mg, Au), and about 50 Å to 1000 Å ITO (or IZO).

A light-emitting material 205 is disposed over the first electrode 215. In some embodiments, the light-emitting material 205 includes organic light-emitting material. In some embodiments, the light-emitting material 205 is a composite film structure having several thin films stacked along the vertical direction (Y axis). The light-emitting material 205 may have several carrier transportation or injection films. The light-emitting material 205 may have an emitting layer (EL). The carrier can be a hole or an electron.

A second electrode 216 is disposed over the light-emitting material 205. In some embodiments, the second electrode 216 is patterned to only cover the effective light-emitting area of each light-emitting pixel. In some embodiments, the second electrode 216 is in contact with the light-emitting material 205. The second electrode 216 may be a continuous film as shown in FIG. 2A and covers the light-emitting material 205 and the spacer bumps 210. In other words, the second electrode 216 is a common electrode for several light-emitting pixels. In some embodiments, the second electrode 216 is a common electrode for all light-emitting pixels in the light-emitting layer 20.

The second electrode 216 may have a thickness between about 80 Å and about 500 Å. In some embodiments, the second electrode 216 may have a thickness between about 80 Å and about 150 Å. In some embodiments, the second electrode 216 may have a thickness between about 150 Å and about 200 Å. In some embodiments, the second electrode 216 may have a thickness between about 200 Å and about 300 Å. In some embodiments, the second electrode 216 may have a thickness between about 300 Å and about 400 Å. In some embodiments, the second electrode 216 may have a thickness between about 400 Å and about 500 Å. In some embodiments, the second electrode 216 is a composite structure. For example, the second electrode 216 has a conductive film and a transparent conductive film thereon. In some embodiments, the conductive film is located between a transparent conductive film and the light-emitting material 205. In some embodiments, the transparent conductive film includes aluminum, gold, silver, copper, magnesium, molybdenum or the like. In some embodiments, the transparent conductive film includes indium, tin, graphene, zinc, oxygen, or the like. In some embodiments, the transparent conductive film comprises ITO (indium tin oxide). In some embodiments, the transparent conductive film comprises IZO (indium zinc oxide). In some embodiments, the transparent conductive film is between the conductive film and the light-emitting material 205.

Figure 2B:
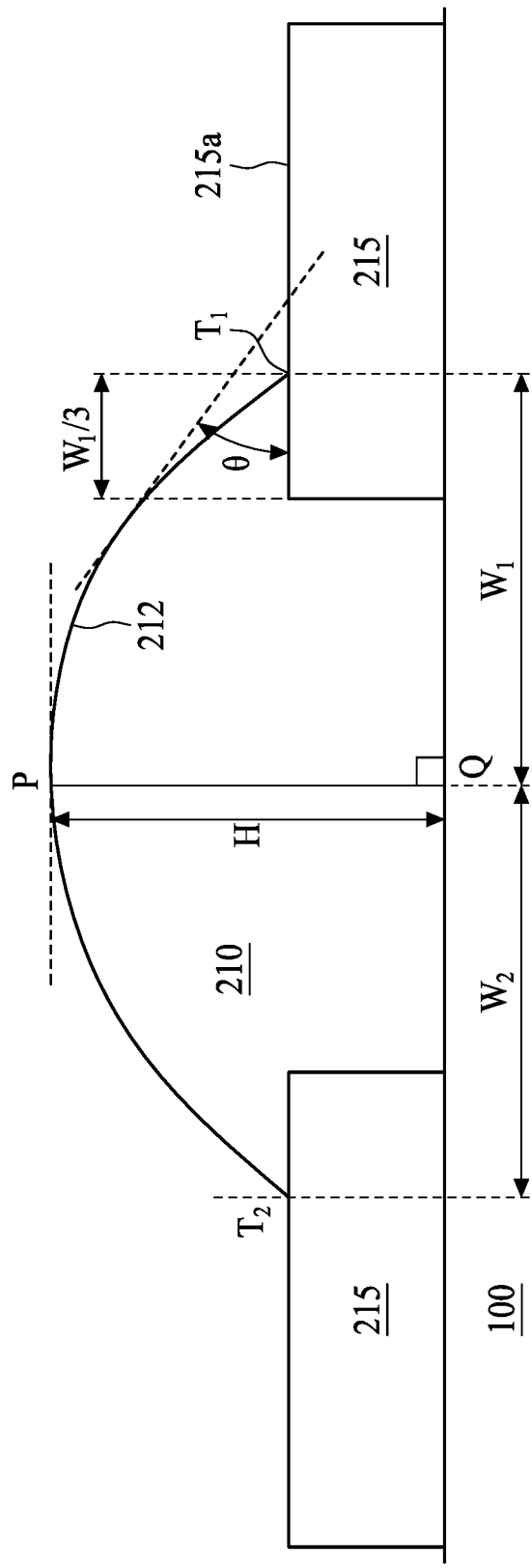
FIG. 2B is a cross-sectional view of a spacer bump that lands on two adjacent first electrodes, according to an embodiment.

In some embodiments, the spacer bump 210 has a curved surface 212 protruding away from the substrate 100, and a portion of the light-emitting material 205 (indicated by a dotted circle) is disposed over the curved surface 212. FIG. 2B illustrates a spacer bump 210 that lands on two adjacent first electrodes 215. The bump 210 has a peak P and the thickness H of the bump is the greatest at the peak P. In the present disclosure, the thickness is measured along the Y axis. For the spacer bump 210, the thickness is measured from the interface (point Q) between the substrate 100 and the spacer bump 210. In some embodiments, the thickness H of the spacer bump 210 at peak P is between about 7000 Å and about 10000 Å. In some embodiments, the thickness H is between about 7000 Å and about 8000 Å. In some embodiments, the thickness H of the spacer bump 210 at peak P is between about 8000 Å and about 9000 Å. In some embodiments, the thickness H of the spacer bump 210 at peak P is between about 9000 Å and about 10000 Å. H is the shortest distance between peak P and point Q. In some embodiments, the thickness H is about 1.5 to 2 times greater than the total thickness of the first electrode 215.

Line PQ is a midway line of the bump 210. A point $T_x$ is where the curved surface 212 meets the first electrode 215. $T_1$ is the right side meeting point and $T_2$ is the left side meeting point. $W_1$ is the distance between meeting point $T_1$ and line PQ, and $W_2$ is the distance between meeting point $T_2$ and line PQ. In some embodiments, $W_1$ is between about 0.8 μm and about 1.6 μm. In some embodiments, $W_1$ is between about 0.8 μm and about 1.0 μm. In some embodiments, $W_1$ is between about 1.0 μm and about 1.2 μm. In some embodiments, $W_1$ is between about 1.2 μm and about 1.4 μm. In some embodiments, $W_1$ is between about 1.4 μm and about 1.6 μm. In some embodiments, $W_1$ is substantially equal to $W_2$. In some embodiments, the difference between $W_1$ and $W_2$ is greater than 8%, i.e., the bump 210 is asymmetrically landed on the adjacent first electrodes.

Another feature of the bump 210 is the angle θ between the curved surface 212 and the first electrode 215. The angle θ is measured by first drawing a tangent line to the curve 212 at a point that is ($\frac{1}{3} \times W_1$) from the meeting point $T_1$. The tangent line is extended to intersect with a surface 215a of the first electrode 215. The angle θ is the angle between the tangent line and the surface 215a. In some embodiments, the angle is between about 35° and about 55°. In some embodiments, the angle is between about 35° and about 45°. In some embodiments, the angle is between about 40° and about 45°. In some embodiments, the angle is between about 45° and about 50°. In some embodiments, the angle is between about 50° and about 55°. In some embodiments, the angle is between about 40° and about 55°.

In some embodiments, the spacer 210 may include fluorine (F). In the spacer 210, a region proximal to the curved surface 212 has a greater F concentration than other regions. In some embodiments, some metal oxide particulates can be added to the spacer 210. The particulates can be used to scatter the light emitted from the light-emitting material 205.

Figure 2C:
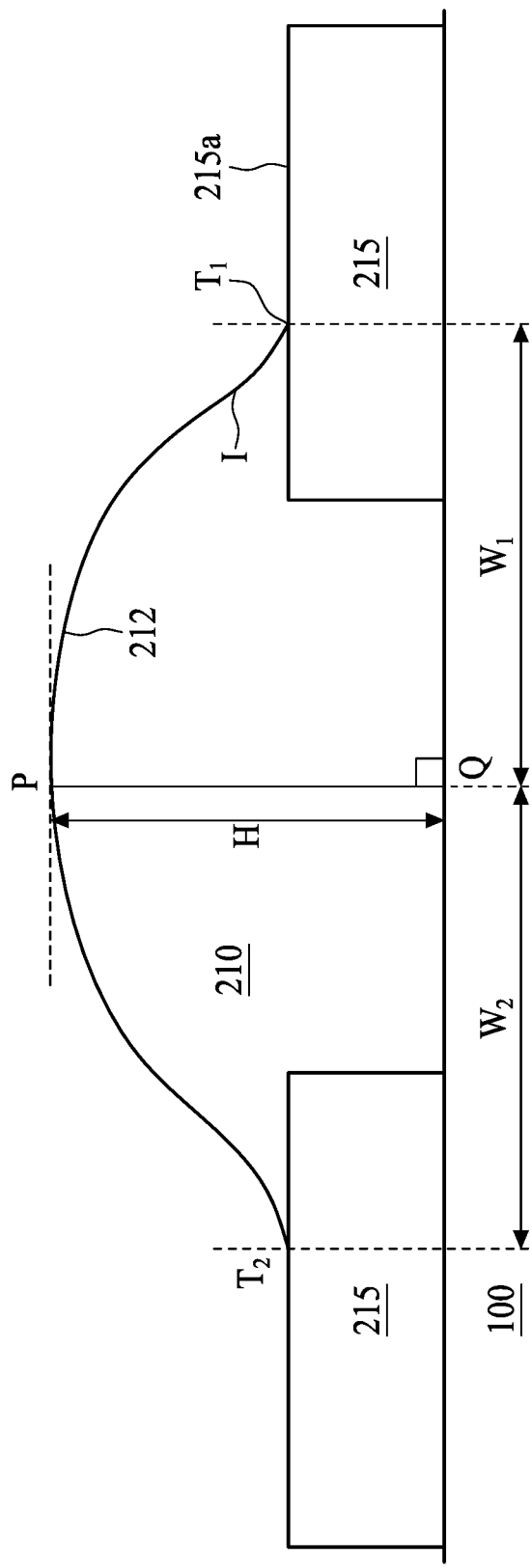
FIG. 2C is a cross-sectional view of a spacer bump, according to an embodiment.

FIG. 2C is another embodiment of a spacer bump 210. The curved surface 212 has an inflection point I proximal to the meeting point $T_1$. The curved surface 212 protrudes away from the substrate 100 between point P and point I. Between the inflection point I and the meeting point $T_1$, the curved surface 212 recesses toward the substrate 100. In some embodiments, the inflection point I is located about ($\frac{1}{6} \times W_1$) from the meeting point $T_1$. In some embodiments, the inflection point I is located about ($\frac{1}{7} \times W_1$) from the meeting point $T_1$. In some embodiments, the inflection point I is located about ($\frac{1}{8} \times W_1$) from the meeting point $T_1$.

Figure 3:
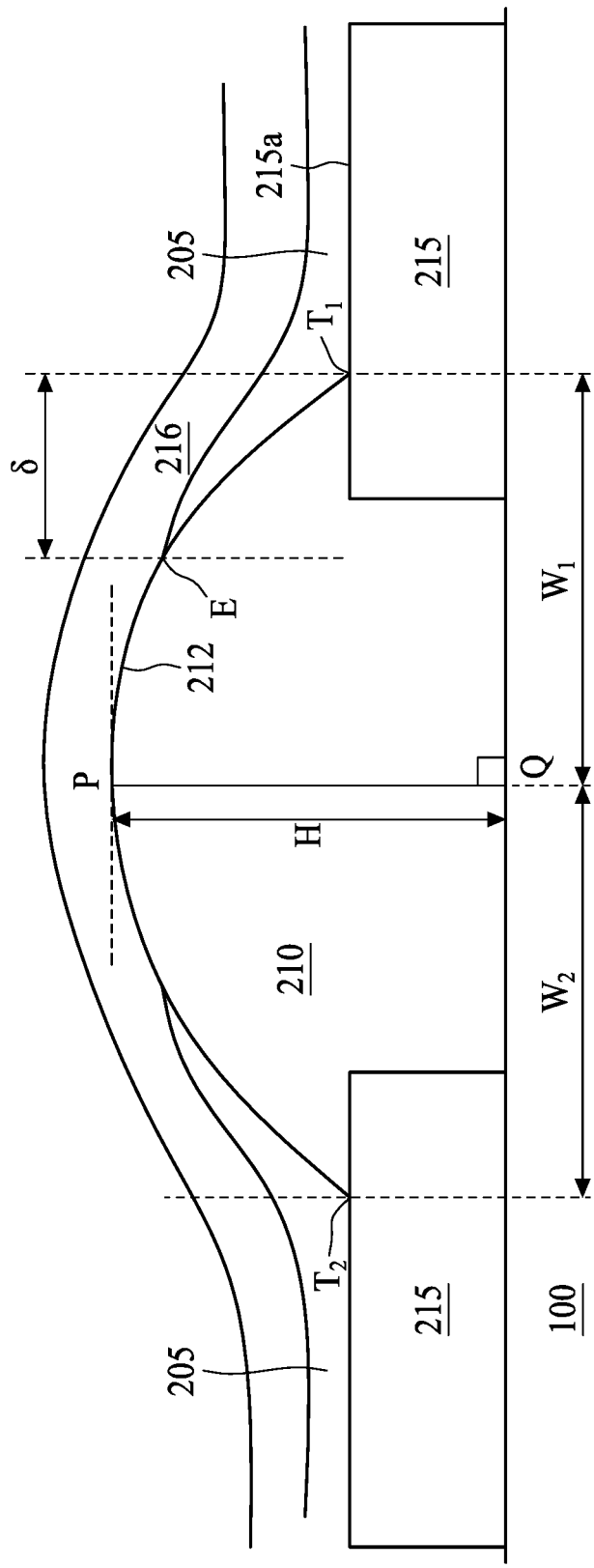
FIG. 3 is a cross-sectional view of a spacer bump, according to an embodiment.

Referring to FIG. 3, the light-emitting material 205 conformally covers the first electrode 215 and further extends to partially cover the curved surface 212, ending at a point E. In other words, the point E is a point where the spacer bump 210, the second electrode 216, and the light-emitting material 205 meet.

The light-emitting material 205 includes a portion overlapping with the first electrode 215. In some embodiments, the portion is also called an effective illumination area. In some embodiments, the effective illumination area has a width less than 10 μm. In some embodiments, the effective illumination area has a width between about 3 μm and about 6 μm. In some embodiments, the effective illumination area has a width between about 4 μm and about 6 μm. The effective illumination area determines the pixel size of the light-emitting device 10 in FIG. 1. Because the size of the effective illumination area can be controlled under 10 μm, the pixel density of the light-emitting device 10 can exceed 1000 ppi or 2000 ppi.

The horizontal distance δ is the distance from the meeting point $T_1$ to the end point E along the X axis. The horizontal distance δ indicates how the light-emitting material 205 overlaps the bump 210. The horizontal distance δ is also called overlap width. In some embodiments, the overlap width δ is equal to about 80% to 85% of $W_1$. In some embodiments, the overlap width δ is equal to about 75 to 80% of $W_1$. In some embodiments, the overlap width δ is equal to about 75 to 90% of $W_1$. In some embodiments, the overlap width δ is between about 0.85 μm and about 1.0 μm. In some embodiments, the overlap width δ is between about 0.8 μm and about 0.9 μm. In some embodiments, the overlap width δ is between about 0.9 μm and about 1.0 μm.

In some embodiments, there are at least two different types of light-emitting pixel in the light-emitting device 10. The first-type pixel emits a light having a first wavelength spectrum, and the second-type pixel emits a light having a second wavelength spectrum which is different from the first wavelength spectrum. In some embodiments, the first-type pixel has an overlap width greater than that of the second-type pixel. In some embodiments, the overlap width of the first-type pixel is about 0.1% greater than that of the second-type pixel. In some embodiments, the overlap width of the first-type pixel is about 60% greater than that of the second-type pixel. In some embodiments, the overlap width of the first-type pixel is between about 0.1% and about 60% greater than that of the second-type pixel.

Figure 4A:
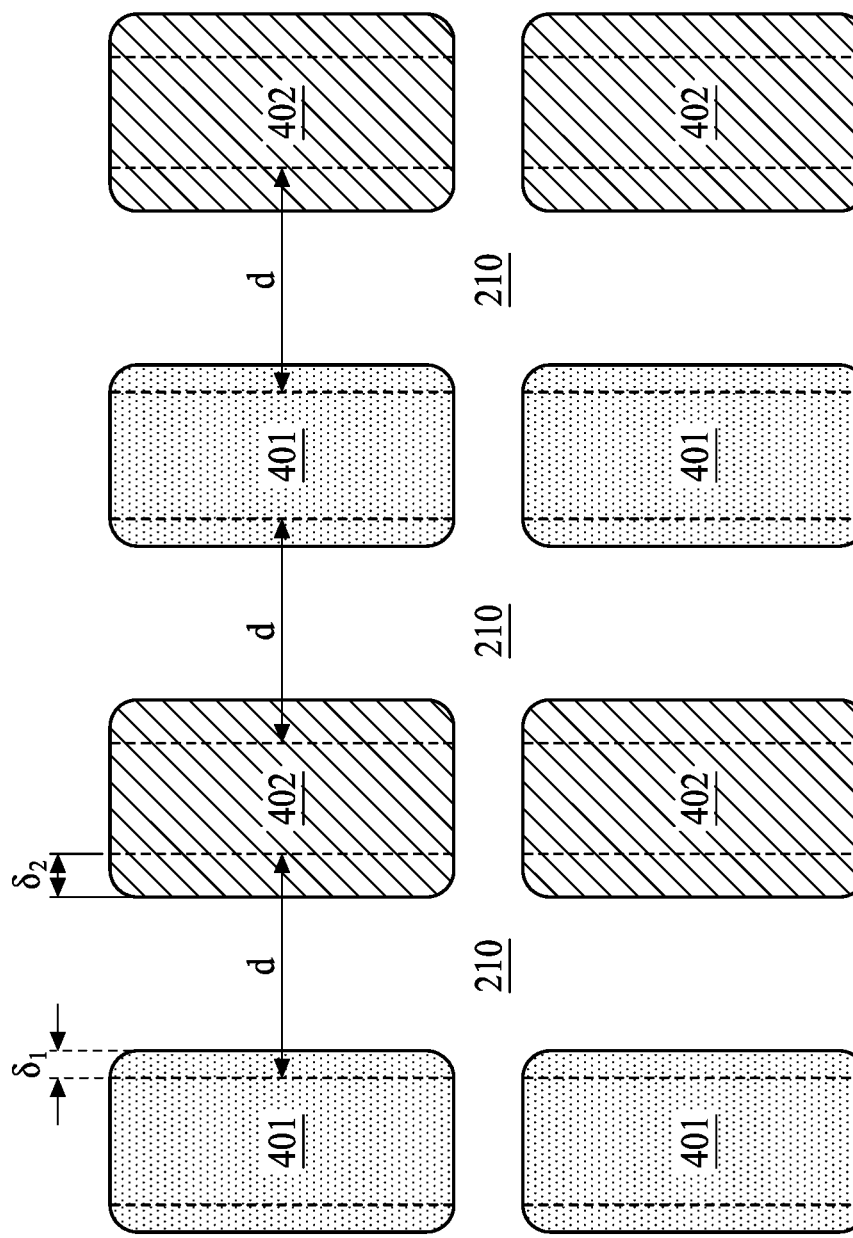
FIG. 4A is a top view of a portion of a light-emitting layer having several light-emitting pixels, according to an embodiment.

FIG. 4A is a top view of a portion of the light-emitting layer 20 having several light-emitting pixels, including the first-type pixels 401 and the second-type pixels 402. The dotted lines represent where the light-emitting material of each pixel meets the spacer bump 210. The dotted lines in FIG. 4A are aligned with the points $T_1$ or $T_2$ in FIG. 3. Spaces d shown in FIG. 4A are equal to the width of the spacer bump 210 in FIG. 3, i.e., $W_1+W_2$. All the spacer bumps have a substantially equal width, however, the overlap widths may be different. The overlap width of the first-type pixel is $\delta_1$ and the overlap width of the second-type pixel is $\delta_2$; $\delta_1$ is less than $\delta_2$. Therefore, although the spacer bumps in the light-emitting layer 20 may have a uniform width, the adjacent pixels have different overlap widths if they are of different types (and therefore emit different wavelength spectra).

FIG. 4B is a top view of a portion of the light-emitting layer 20 having several light-emitting pixels, including the first-type pixel 401, the second-type pixel 402, and the third-type pixel 403. The dotted lines represent where the light-emitting material of each pixel meets the spacer bump 210. The dotted lines in FIG. 4B are aligned with the points $T_1$ or $T_2$ in FIG. 3. Spaces d shown in FIG. 4B are equal to the width of the spacer bump 210 in FIG. 3, i.e., $W_1+W_2$. All the spacer bumps have a substantially equal width, however, the overlap widths may be different. The overlap width of the first-type pixel is $\delta_1$, the overlap width of the second-type pixel is $\delta_2$, and the overlap width of the third-type pixel is $\delta_3$. The value $\delta_1$ is less than $\delta_2$, and $\delta_2$ is less than $\delta_3$. Similar to the configuration of FIG. 4A, the spacer bumps in the light-emitting layer 20 have a uniform width, but the adjacent pixels have different overlap widths if they are of different types (and therefore emit different wavelength spectra). In some embodiments, $\delta_1$ is about 0.1% to about 60% less than $\delta_2$, and $\delta_2$ is about 0.1% to about 60% less than $\delta_3$.

Figure 5:
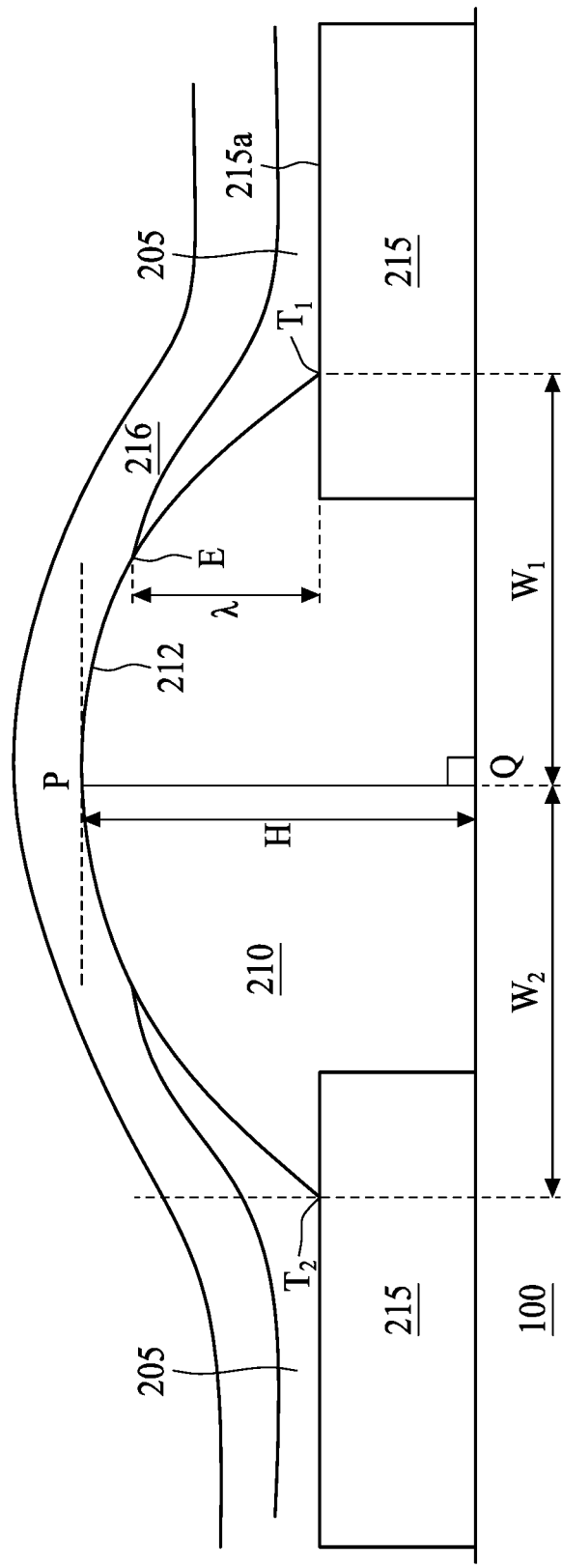
FIG. 5 is a cross-sectional view of a spacer bump, according to an embodiment.

As shown in FIG. 5, a vertical distance λ is the distance from the meeting point $T_1$ to the end point E measured along the Y axis. The vertical distance λ can also be used to indicate how the light-emitting material 205 overlaps or covers the bump 210. The vertical distance λ is also called overlap height. In some embodiments, the overlap height λ is equal to about 60% to 80% of the thickness H of the spacer bump. In some embodiments, the overlap height λ is equal to about 60% to 75% of the thickness H. In some embodiments, the overlap height λ is equal to about 65% to 75% of the thickness H. In some embodiments, the overlap height λ is equal to about 70% to 80% of the thickness H. In some embodiments, the overlap height λ is equal to about 70% to 75% of the thickness H. In some embodiments, the overlap height λ is equal to about 75% to 80% of the thickness H.

In some embodiments, the overlap height λ is between about 0.6 μm and about 0.8 μm. In some embodiments, the overlap height λ is between about 0.65 μm and about 0.7 μm. In some embodiments, the overlap height λ is between about 0.7 μm and about 0.75 μm. In some embodiments, the overlap height λ is between about 0.75 μm and about 0.8 μm.

In some embodiments, the first-type pixel has an overlap height greater than that of the second-type pixel. In some embodiments, the overlap height of the first-type pixel is about 20% to about 50% greater than that of the second-type pixel. In some embodiments, the first-type pixel has an overlap height greater than that of the second-type pixel, and the second-type pixel has an overlap height greater than that of the third-type pixel. In some embodiments, the overlap height of the first-type pixel is about 20% to about 50% greater than that of the second-type pixel. In some embodiments, the overlap height of the second-type pixel is about 20% to about 50% greater than that of the third-type pixel.

In some embodiments, a portion of the light-emitting material 205 is in contact with the curved surface 212. The portion of the light-emitting material 205 in contact with the curved surface 212 is conformal to the curved surface 212.

In some embodiments, the electrode 215 is a composite structure. For example, the electrode 215 has a conductive film and a transparent conductive film thereon. FIG. 6A is an example of the electrode 215. As shown in FIG. 6A, a conductive film 2151 is located between a transparent conductive film 2152 and a substrate 100. In some embodiments, the conductive film 2151 includes aluminum, gold, silver, copper, or the like. In some embodiments, the transparent conductive film 2152 includes indium, tin, graphene, zinc, oxygen, or the like. In some embodiments, the transparent conductive film 2152 comprises ITO (indium tin oxide). In some embodiments, the transparent conductive film 2152 comprises IZO (indium zinc oxide). The conductive film 2151 may have a thickness between about 1500 Å and about 3000 Å. The transparent conductive film 2152 may have a thickness between about 80 Å and about 1000 Å.

Figure 6B:
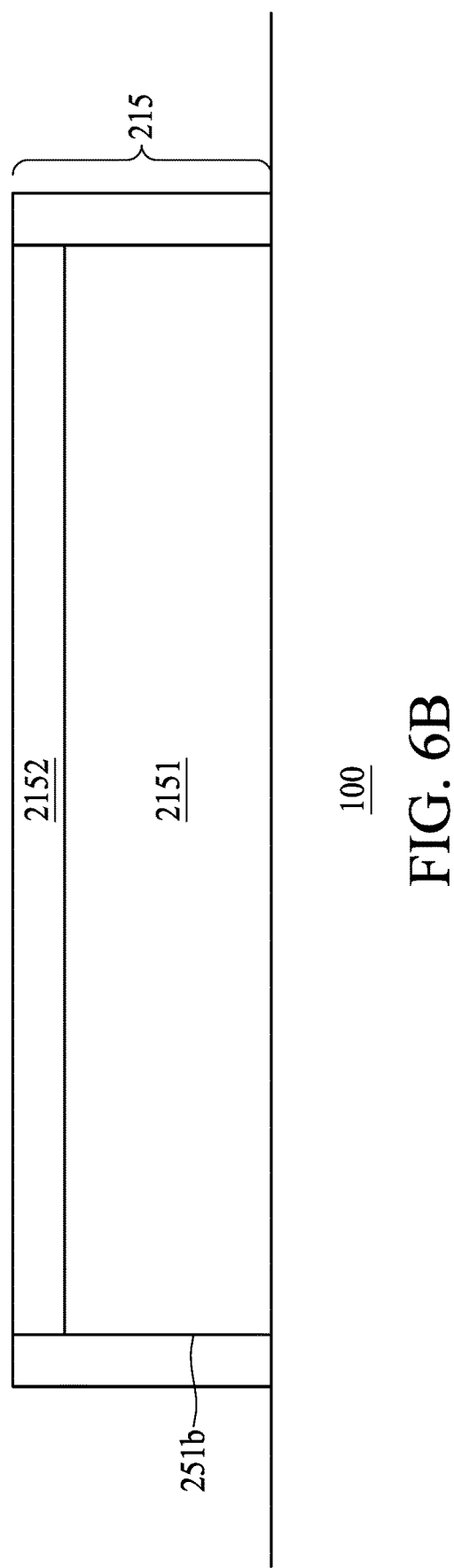
FIG. 6B is a cross-sectional view of an electrode, according to an embodiment.
Figure 6C:
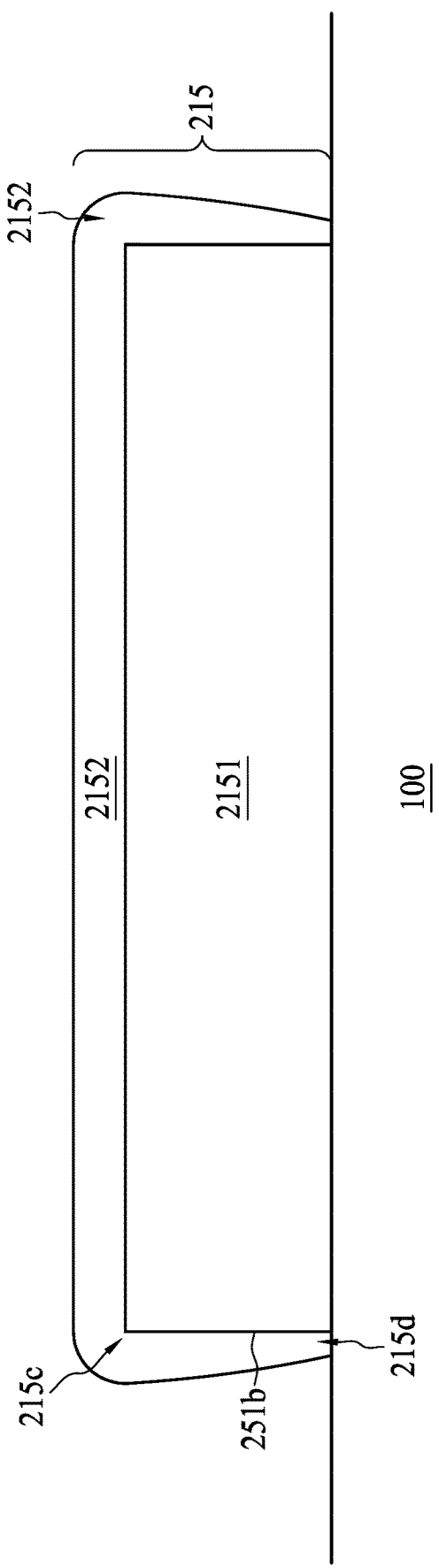
FIG. 6C is a cross-sectional view of an electrode, according to an embodiment.

In some embodiments, as shown in FIG. 6B, the transparent conductive film 2152 is further extended to cover a sidewall 215b of the conductive film 2151. In some embodiments, as shown in FIG. 6C, along the sidewall 215b, the transparent conductive film 2152 has a greatest thickness at a topmost portion 215c of the sidewall 215b and a least thickness at a bottom-most portion 215d (where the transparent conductive film 2152 meets the substrate 100) of the sidewall 215b. In some embodiments, the thickness of the transparent conductive film 2152 increases in proportion to vertical distance from the substrate 100.

Figure 7A:
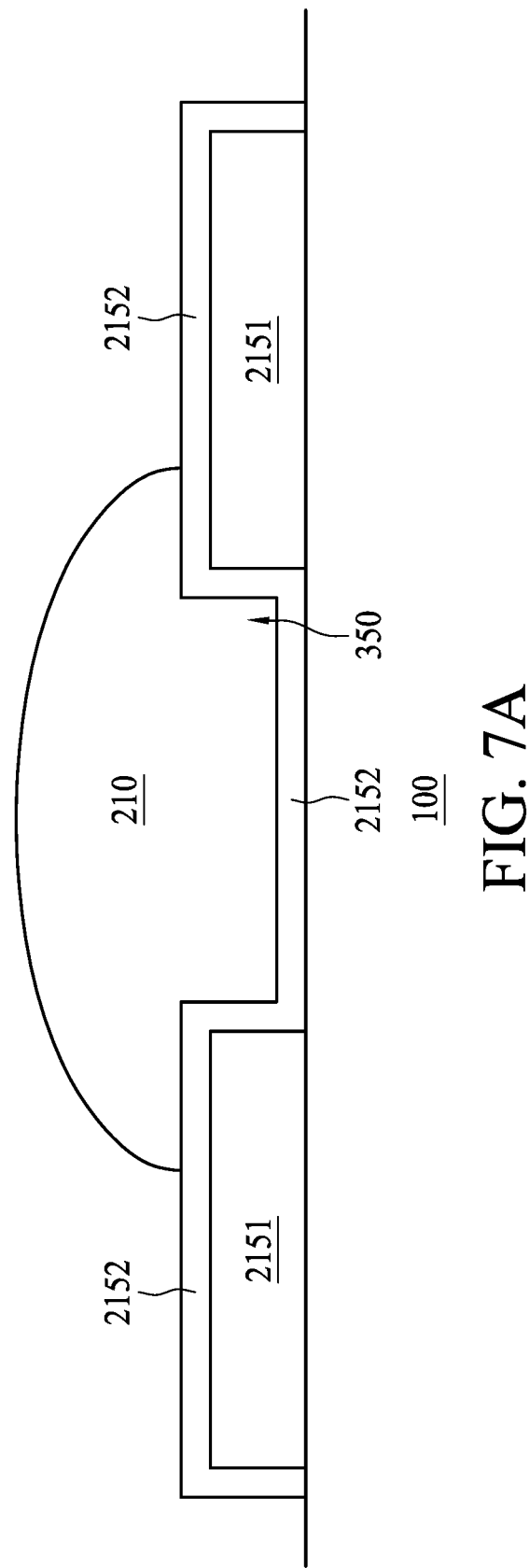
FIG. 7A is a cross-sectional view of an electrode, according to an embodiment.
Figure 7B:
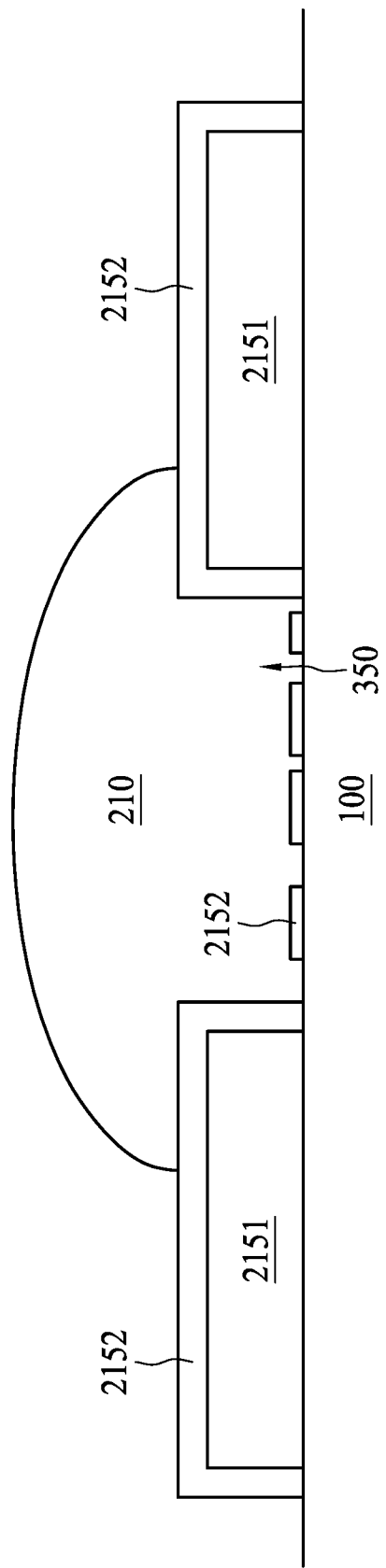
FIG. 7B is a cross-sectional view of an electrode, according to an embodiment.

In some embodiments, as shown in FIG. 7A, the transparent conductive film 2152 is further extended to a valley 350 between two adjacent but separated conductive films 2151. The valley is filled with the spacer bump 210. In the valley 350, one side of the transparent conductive film 2152 is in contact with the substrate 100 and the opposite side of the transparent conductive film 2152 is in contact with the spacer bump 210. The conductive film 2151 is entirely absent from the valley 350. The transparent conductive film 2152 may be continuous or broken into several segments between the spacer bump 210 and the substrate 100. As shown in FIG. 7B. In some embodiments, the transparent conductive film 2152 is broken into several segments randomly distributed over the substrate. In some embodiments, the average thickness of the transparent conductive film 2152 in the valley 350 is between about ¼ and about ½ of the thickness of the transparent conductive film layer 2152 above the conductive film 2151.

In some embodiments, the first electrode 215 includes at least three different films. A conductive film, comprising a material such as Al, Cu, Ag, Au or the like, is sandwiched between two transparent conductive films. In some embodiments, one of the two transparent conductive films comprises ITO, where one side of the transparent conductive film is in contact with the substrate 100 and the other side of the transparent conductive film is in contact with the conductive film. In some embodiments, the other of the two transparent conductive films also comprises ITO, wherein one side of the transparent conductive film is in contact with the conductive film and the other side of the transparent conductive film is in contact with the spacer bump 210 or the light-emitting material 205.

Figure 8:
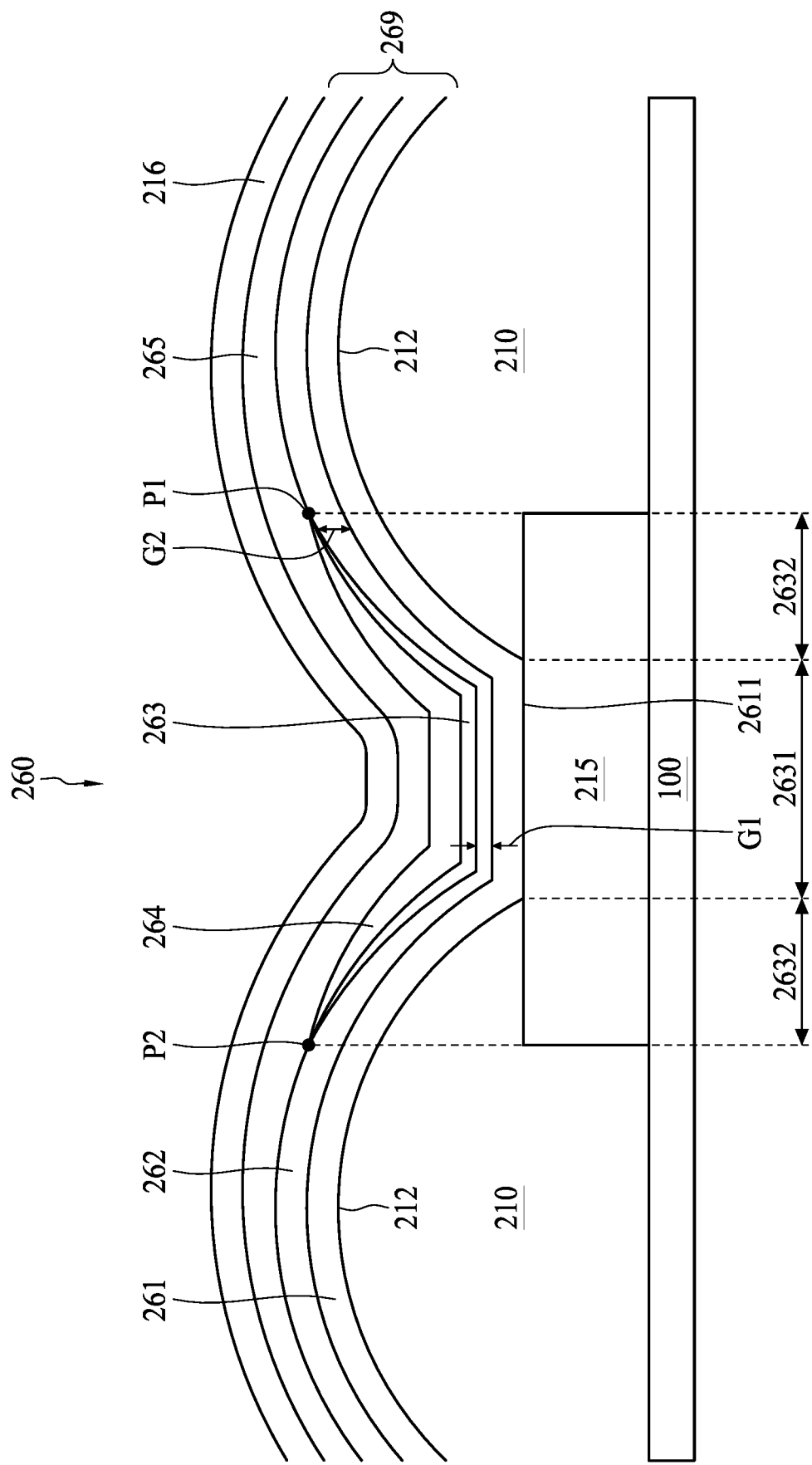
FIG. 8 is a cross-sectional view of a light-emitting device, according to an embodiment.

FIG. 8 illustrates an embodiment of a light-emitting device. FIG. 8 is a cross-sectional view of the light-emitting device according to aspects of the present disclosure in some embodiments. The light-emitting device includes a substrate 100, bumps 210 over the substrate 100, and a light-emitting unit 260 between the bumps 210 and over the substrate 100.

The light-emitting unit 260 includes a first electrode 215 on the substrate 100, an organic layer 269 on the first electrode 215, and a second electrode 216 on the organic layer 269. The organic layer 269 can be formed by various processes such as vapor deposition, liquid jetting or inkjet printing. In some embodiments, the light-emitting unit 260 includes a first electrode 215, a first carrier transportation layer 262 over the bumps 210 and the first electrode 215, a second carrier transportation layer 263 over a portion of the first carrier transportation layer 262, and an organic emissive layer 264 over the second carrier transportation layer 263. In some embodiments, a carrier injection layer 261 is disposed between the first electrode 215 and the first carrier transportation layer 262.

The pattern of the first electrode array is designed in accordance with the pixel arrangement. The pattern of the bumps 210 is designed in accordance with the pixel arrangement, and the patterned bumps 210 can be referred to as a pixel-defined layer (PDL). Each bump 210 fills the gap between two adjacent first electrodes 215. Each first electrode 215 is partially covered by the bumps 210.

In some embodiments, the carrier injection layer 261 is disposed over the exposed surfaces of the bumps 210 and the first electrode 215. The carrier injection layer 261 continuously covers the exposed surfaces of the bumps 210 and the first electrode 215. In some embodiments, the exposed surface of each first electrode 215 is configured as an effective light-emitting area for one light-emitting unit 260. Optionally, the carrier injection layer 261 is in contact with the PDL bumps 210. In some embodiments, the carrier injection layer 261 is in contact with the first electrodes 215. In some embodiments, the carrier injection layer 261 is organic. In some embodiments, the carrier injection layer 261 is configured to perform hole injection. In some embodiments, the carrier injection layer 261 is a hole injection layer.

The first carrier transportation layer 262 is disposed over the exposed surfaces of the bumps 210 and the first electrodes 215. The carrier injection layer 261 is disposed under the first carrier transportation layer 262. The first carrier transportation layer 262 continuously covers the carrier injection layer 261. The first carrier transportation layer 262 overlies several PDL bumps 210 and several first electrodes 215. Optionally, the first carrier transportation layer 262 is in contact with the carrier injection layer 261. In some embodiments, the first carrier transportation layer 262 is organic. In some embodiments, the first carrier transportation layer 262 is configured to perform hole transportation. In some embodiments, the first carrier transportation layer 262 is a first hole transportation layer.

In some embodiments, the carrier injection layer 261 is configured to be broken into segments and the first carrier transportation layer 262 continuously covers exposed portions of the bumps 210 and the segmented carrier injection layer 261. Each segment of the carrier injection layer 261 may be vertically aligned with the first electrode 215. In other words, the carrier injection layer 261 does not continuously cover the exposed portions of the bumps 210 and the first electrode 215. Each light-emitting unit 260 has a separate carrier injection layer 261 disposed thereon.

The second carrier transportation layer 263 is disposed over a portion of the first carrier transportation layer 262. The second carrier transportation layer 263 may be vertically aligned with the first electrode 215. The second carrier transportation layer 263 includes a central region 2631 and a peripheral region 2632 surrounding the central region 2631. In some embodiments, the central region 2631 is vertically aligned with an interface 2611 between the carrier injection layer 261 and the first electrode 215. In some embodiments, the peripheral region 2632 is vertically aligned with the portion of the light-emitting device between the meeting point $T_1$ and the end point E in FIG. 3.

A portion of the first carrier transportation layer 262 overlapped by the peripheral region 2632 of the second carrier transportation layer 263 has a thickness G2 greater than a thickness G1 of a portion of the first carrier transportation layer 262 overlapped by the central region 2631 of the second carrier transportation layer 263. In some embodiments, a ratio of a thickness of the second carrier transportation layer 263 to a thickness of the first carrier transportation layer 262 is between 0.1 and 0.7. The second carrier transportation layer 263 may have a thickness between 1 nm and 100 nm. In some embodiments, the second carrier transportation layer 263 has a thickness between 5 nm and 80 nm.

In some embodiments, in contrast to the thickness of the second carrier transportation layer 263, the thickness of the first carrier transportation layer 262 is non-uniform. In contrast to the upper surface of the second carrier transportation layer 263, the upper surface of the first carrier transportation layer 262 may be rough. In some embodiments, in contrast to the interface between the carrier injection layer 261 and the first carrier transportation layer 262, the interface between the first carrier transportation layer 262 and the second carrier transportation layer 263 between point P1 and point P2 is undulating. The second carrier transportation layer 263 may have greater uniformity than the first carrier transportation layer 262. In some embodiments, the first carrier transportation layer 262 may have greater thickness uniformity than the second carrier transportation layer 263. In some embodiments, the second carrier transportation layer 263 is conformal to the underlying layers, which include the first carrier transportation layer 262 and the carrier injection layer 261 disposed on the bumps 210 and the first electrode.

As seen from a cross-sectional perspective, the second carrier transportation layer 263 extends from point P1 to point P2 of the first carrier transportation layer 262. A first end of the organic emissive layer 264 is at point P1. Similarly, a second end, which is opposite to the first end, of the organic emissive layer 264 is at point P2. The first carrier transportation layer 262 has different thicknesses on either side of each of point P1 and point P2. For example, the thickness of the first carrier transportation layer 262 on the side of point P1 proximal to point P2 is greater than the thickness of the first carrier transportation layer 262 on the side of point P1 distal from point P2. Similarly, the thickness of the first carrier transportation layer 262 on the side of point P2 proximal to point P1 is greater than the thickness of the first carrier transportation layer 262 on the side of point P2 distal from point P1. In some embodiments, the thickness of the first carrier transportation layer 262 between point P1 and point P2 is less than the thickness of the first carrier transportation layer 262 outside of point P1 and point P2. A vertical distance between point P1 and the substrate 100 may be different from or equal to a vertical distance between point P2 and the substrate 100.

Figure 9:
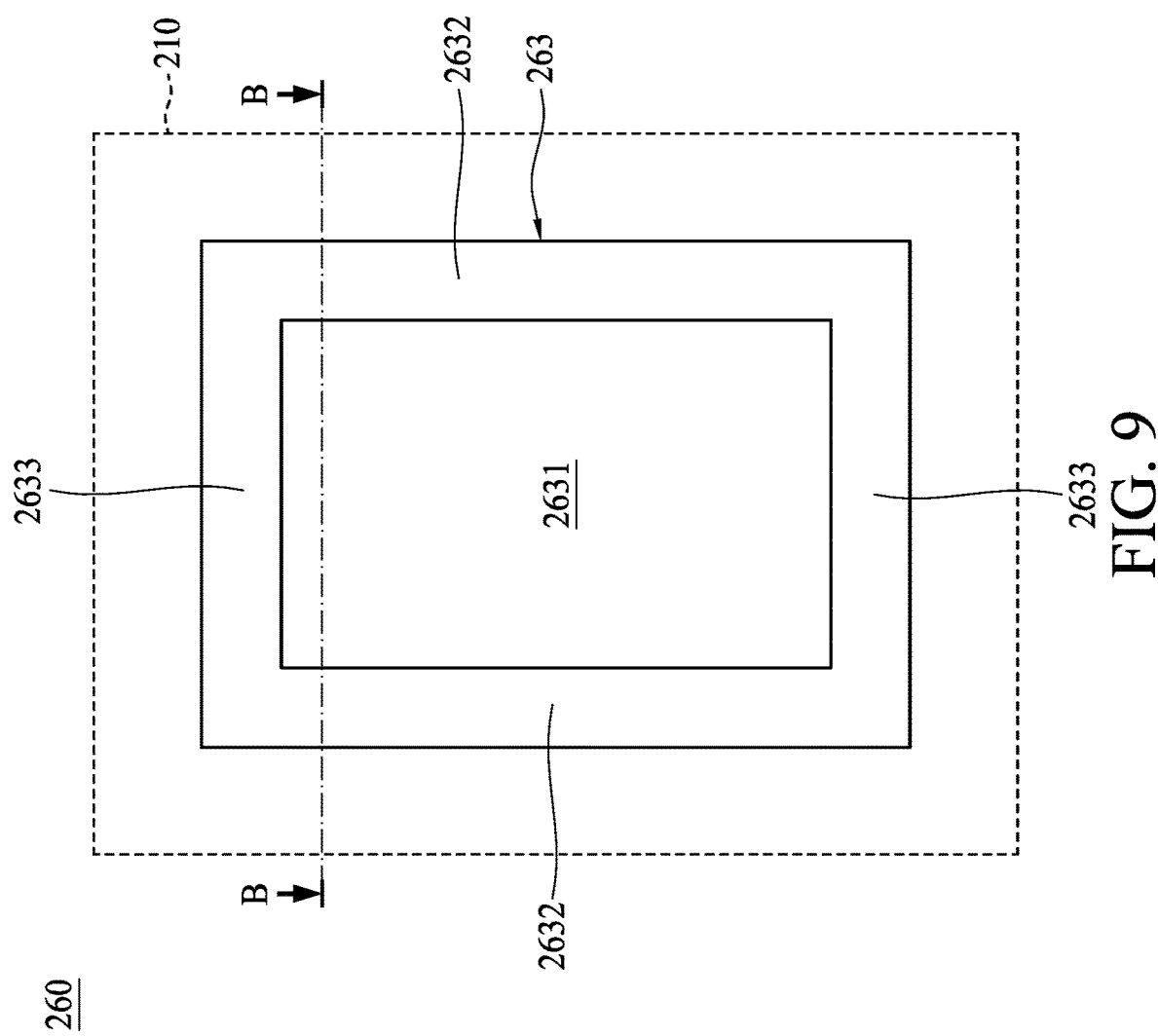
FIG. 9 is a top view of a light-emitting device, according to an embodiment.

FIG. 9 is a top view of the light-emitting unit 260 shown in FIG. 8. (FIG. 8 is a cross-sectional view along line B-B of FIG. 9.) Both the central region 2631 and the peripheral region 2632 are shown in FIG. 9 as rectangular in shape, but other shapes can be adopted according to the designer's preference. The surface area of each region depends on the interface 2611 between the carrier injection layer 261 and the first electrode 215. The surface area of each of the two peripheral regions 2632 disposed on the sides of the central region 2631 may be same or different.

Another region 2633 of the second carrier transportation layer 263 is shown in FIG. 9. Regions 2632 and regions 2633 can be merged into a continuous ring. The ring pattern is the periphery of the central region 2631. The width of the ring pattern may not be uniform and may vary by sections. For example, a width of the region 2632 may be different from a width of the region 2633 in a same ring. From a top view, outer borders of the regions 2632 and the regions 2633 may be the borders of the organic emissive layer 264.

Referring back to FIG. 8, in some embodiments, at least one of the first carrier transportation layer 262 and the second carrier transportation layer 263 includes an organic material. The organic material may comprise a molecular structure having a resonance structure. The organic material may be selected from a group consisting of spiro-triarylamine, bis-triarylamine, and the combination thereof. In some embodiments, at least one of the first carrier transportation layer 262 and the second carrier transportation layer 263 includes spiro-triarylamine. In some embodiments, at least one of the first carrier transportation layer 262 and the second carrier transportation layer 263 includes bis-triarylamine. In some embodiments, the first carrier transportation layer 262 and the second carrier transportation layer 263 include the same material. In some embodiments, the first carrier transportation layer 262 includes

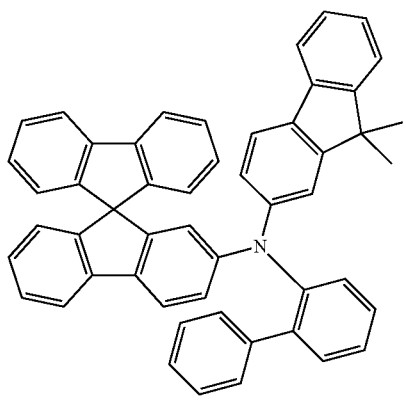 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

and the second carrier transportation layer 263 includes

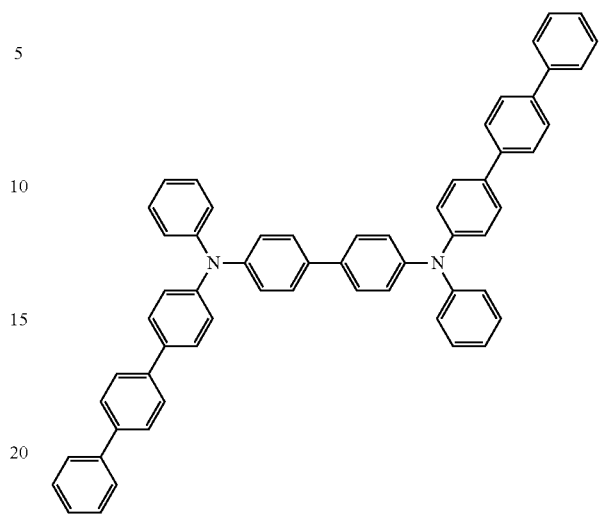

The organic emissive layer 264 is disposed over and fully covers the second carrier transportation layer 263. The periphery of the organic emissive layer 264 overlaps the periphery of the second carrier transportation layer 263. The organic emissive layer 264 extends between point P1 and point P2. The organic emissive layer 264 is configured to emit a first color. The organic emissive layer 264 includes an organic light-emitting material.

In some embodiments, a first end of the organic emissive layer 264 meets the first carrier transportation layer 262 and the second carrier transportation layer 263 at point P1. The organic emissive layer 264 further has a second end opposite to the first end. Similarly, the second end of the organic emissive layer 264 meets the first carrier transportation layer 262 and the second carrier transportation layer 263 at point P2.

In some embodiments, an organic carrier transportation layer 265 is disposed over the organic emissive layer 264. The organic carrier transportation layer 265 can be an electron transportation layer. In some embodiments, the organic carrier transportation layer 265 and the first carrier transportation layer 262 are respectively configured for opposite charges.

In some embodiments, the organic carrier transportation layer 265 is disposed over and fully covers the organic emissive layer 264. The periphery of the organic carrier transportation layer 265 may overlap the periphery of the organic emissive layer 264 and the periphery of the second carrier transportation layer 263. The organic carrier transportation layer 265 extends between point P1 and point P2. In some embodiments, the organic carrier transportation layer 265 is disposed over and continuously covers the organic emissive layer 264 and a portion of the first carrier transportation layer 262 exposed through the organic emissive layer 264. In some embodiments, the organic carrier transportation layer 265 is in contact with the organic emissive layer 264 and the portion of the first carrier transportation layer 262 exposed through the organic emissive layer 264. In some embodiments, a second electrode 216 is disposed over the organic carrier transportation layer 265.

In some embodiments, an organic carrier injection layer is disposed between the organic carrier transportation layer

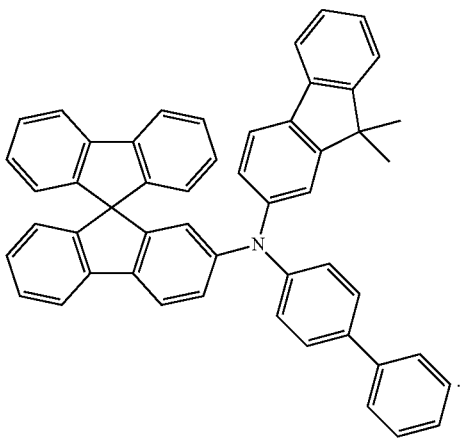 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

In some embodiments, the first carrier transportation layer 262 includes

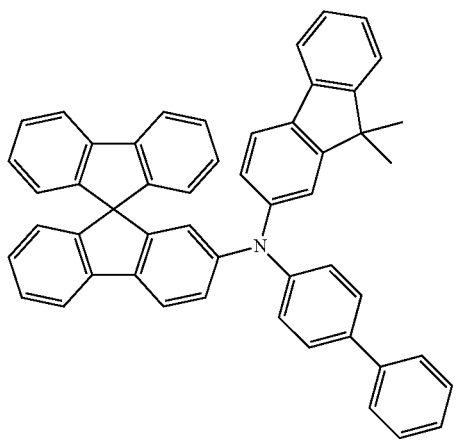 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

265 and the second electrode 216. In some embodiments, the light-emitting unit 260 has an independent organic carrier injection layer. In some embodiments, the organic carrier injection layer is disposed over and continuously covers the organic carrier transportation layer 265, and the second electrode 216 is disposed over and continuously covers the organic carrier injection layer. In some embodiments, the organic carrier transportation layer 265 is configured to perform electron transportation and electron injection. In some embodiments, the organic carrier injection layer is configured to perform electron transportation and electron injection. In some embodiments, the organic carrier injection layer is an electron injection layer.

Figure 10:
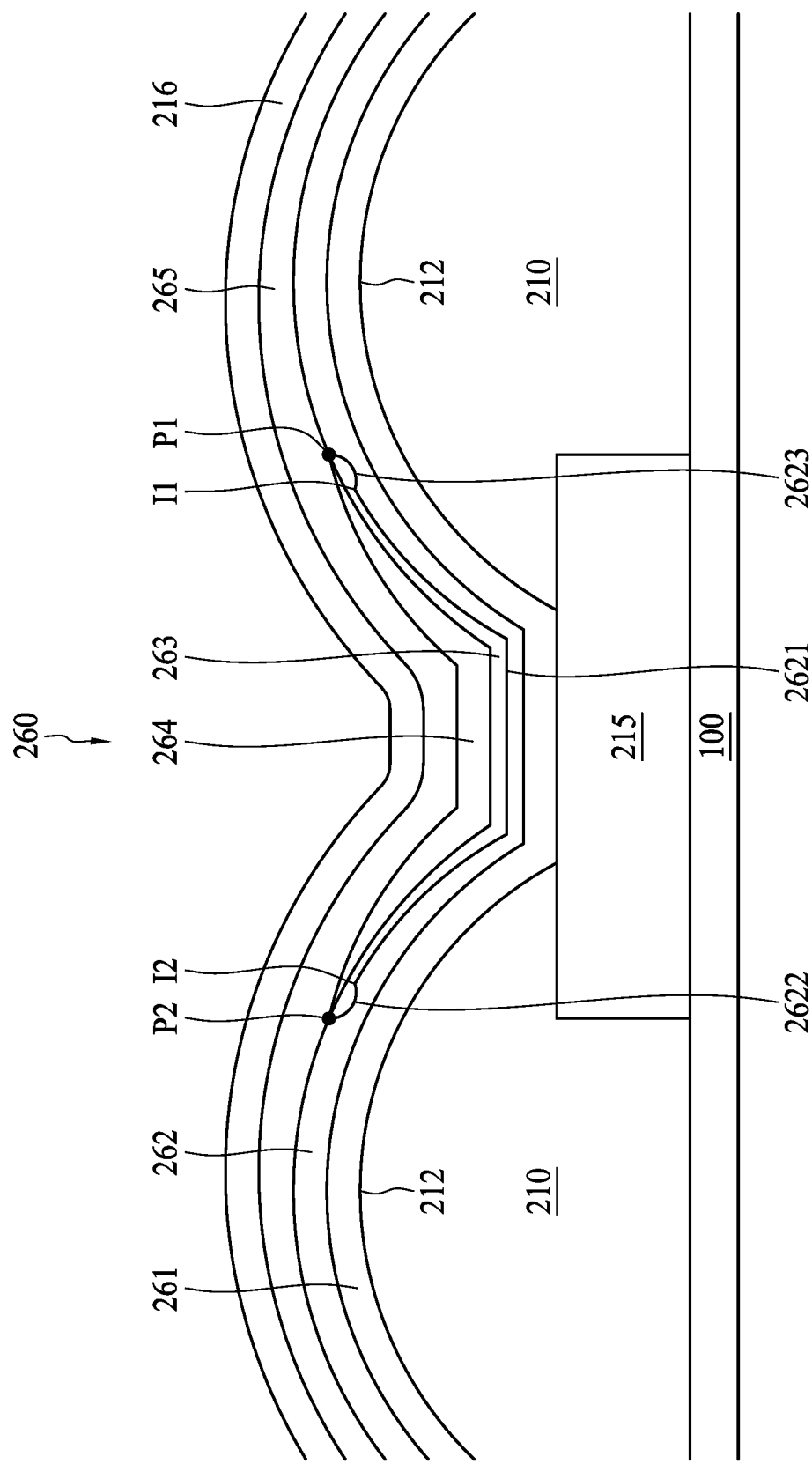
FIG. 10 is a cross-sectional view of a light-emitting device, according to an embodiment.

FIG. 10 is a cross-sectional view illustrating another embodiment of the light-emitting device. Referring to FIG. 10, in some embodiments, an interface 2621 between the first carrier transportation layer 262 and the second carrier transportation layer 263 extends between point P1 and point P2. The interface 2621 may be curved and undulating. In some embodiments, the interface 2621 includes a recess, such as a V-shape recess. The first carrier transportation layer 262 includes an inflection point I1 located at the interface 2621 and proximal to point P1. Compared to point P2, the inflection point I1 is closer to point P1. In some embodiments, point P1 is closer to an apex of the bump 210 than point I1. The interface 2621 is recessed toward the substrate 100 between point P1 and the inflection point I1; in other words, the first carrier transportation layer 262 includes a recess 2623 between point P1 and the inflection point I1. Proximal to the center of the light-emitting device 260 from the inflection point I1, the interface 2621 forms a convex shape that protrudes away from the substrate 100. In some embodiments, the recess 2623 is a V-shape recess.

Similarly, another inflection point I2 is located at the interface 2621 and proximal to point P2. Compared to point P1, the inflection point I2 is closer to point P2. In some embodiments, point P2 is closer to an apex of the bump 210 than point I2. The interface 2621 is recessed toward the substrate 100 between point P2 and inflection point I2; in other words, the first carrier transportation layer 262 includes a recess 2622 between point P2 and the inflection point I2. Proximal to the center of the light-emitting device 260 from the inflection point I2, the interface 2621 forms a convex shape that protrudes away from the substrate 100. In some embodiments, the recess 2622 is a V-shape recess.

Figure 11:
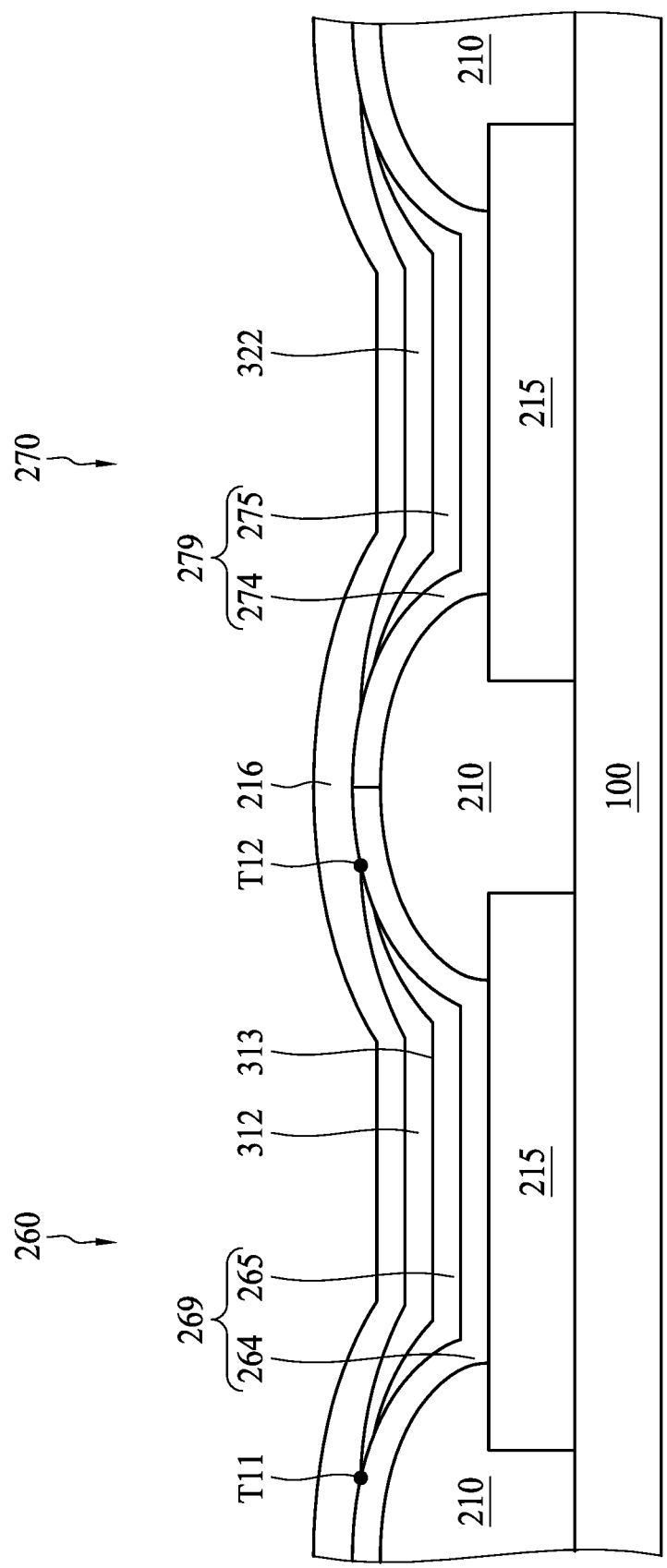
FIG. 11 is a cross-sectional view of a light-emitting device, according to an embodiment.

FIG. 11 is a cross-sectional view of the light-emitting device illustrating another embodiment of the present invention. The light-emitting device includes a substrate 100, a plurality of bumps 210 over the substrate 100, and a plurality of light-emitting units separated by the bumps 210.

The light-emitting units include a first light-emitting unit 260 and a second light-emitting unit 270. The light-emitting units 260, 270 each includes a first electrode 215 on the substrate 100, an organic layer 269, 279 on the first electrode, and a second electrode 216 on the organic layer 269, 279. The first light-emitting unit 260 is as described above or shown in FIGS. 8 to 10, and the second light-emitting unit 270 is in a configuration similar to that of the first light-emitting unit 260. Additionally, while the first and second light-emitting units 260, 270 are illustrated as having similar features, this is intended to be illustrative and is not intended to limit the embodiments. The first and second light-emitting units 260, 270 may have similar structures or different structures in order to meet the desired functional requirements.

In some embodiments, the first light-emitting unit 260 and the second light-emitting unit 270 are adjacent to each other. In some embodiments, the light-emitting device includes a plurality of light-emitting units, and the first and second light-emitting units 260, 270 can be any two of the plurality of light-emitting units. A person ordinarily skilled in the art would readily understand that any suitable number of the light-emitting units may alternatively be utilized, and all such combinations are fully intended to be included within the scope of the embodiments.

In some embodiments, the first light-emitting unit 260 is configured to display a first color, and the second light-emitting unit 270 is configured to display a second color different from the first color. A thickness of the organic layer 269, 279 may be related to the color displayed by the corresponding light-emitting unit 260, 270. The thicknesses of the organic layers 269, 279 may be different. In some embodiments, a thickness of the formerly-formed organic layer 269 of the first light-emitting unit 260 is less than a thickness of the latterly-formed organic layer 279 of the second light-emitting unit 270, and a wavelength of a light emitted from the first light-emitting unit 260 is greater than a wavelength of a light emitted from the second light-emitting unit 270. In some embodiments, the first light-emitting unit 260 emits green light or red light. In some embodiments, the first light-emitting unit 260 emits green light, and the second light-emitting unit 270 emits red light or blue light. The organic layers 269, 279 can be formed by various processes such as vapor deposition, liquid jetting or inkjet printing.

In some embodiments, the thickness of the organic layer 269 of the first light-emitting unit 260 is equal to about 20% to about 80% of the thickness of the organic layer 279 of the second light-emitting unit 270. In some embodiments, the thickness of the organic layer 269 of the first light-emitting unit 260 is equal to about 30% to about 50% of the thickness of the organic layer 279 of the second light-emitting unit 270.

In some embodiments, a thickness uniformity of the organic layer 269 of the first light-emitting unit 260 is greater than a thickness uniformity of the organic layer 279 of the second light-emitting unit 270. In some embodiments, a brightness of the first light-emitting unit 260 is less than a brightness of the second light-emitting unit 270.

In some embodiments, each of the organic layers 269, 279 includes an organic emissive layer 264, 274 on the first electrode 215 and an electrode transportation layer 265, 275 disposed over the organic emissive layer 264, 274. In some embodiments, the thickness of the electrode transportation layer 265 of the first light-emitting unit 260 is less than the thickness of the electrode transportation layer 275 of the second light-emitting unit 270. The thickness of the electrode transportation layer 265 of the first light-emitting unit 260 is equal to about 20% to about 80% of the thickness of the electrode transportation layer 275 of the second light-emitting unit 270. In some embodiments, a thickness uniformity of the electrode transportation layer 265 of the first light-emitting unit 260 is greater than a thickness uniformity of the electrode transportation layer 275 of the second light-emitting unit 270. In some embodiments, each electrode transportation layer 265, 275 includes sub-layers.

The thickness of the organic emissive layer 264 of the first light-emitting unit 260 and the thickness of the organic emissive layer 274 of the second light-emitting unit 270 may be substantially equal.

As seen from a cross-sectional perspective, the first light-emitting unit 260 further includes an intermediate layer 312 between the organic layer 269 and the second electrode 216. In some embodiments, the thickness of the intermediate layer 312 is non-uniform, and the second electrode 216 is conformal to the intermediate layer 312.

In some embodiments, the thickness of the organic layer 269 is non-uniform. The non-uniform thickness of the organic layer 269 may be caused by the manufacturing process of the light-emitting device. In some embodiments, the thickness of the organic layer 269 is related to the thickness of the intermediate layer 312. In some embodiments, the less of the thickness of the organic layer 269, the greater of the thickness of the intermediate layer 312.

In some embodiments, an upper surface 313 of an organic layer 269 is an interface between the organic layer 269 and the intermediate layer 312. The upper surface 313 may be rough and undulating due to the manufacturing process of the light-emitting device. In some embodiments, the roughness of the upper surface 313 is non-uniform, the upper surface 313 includes many areas of varying roughness, and the roughness of each area is related to the thickness of the intermediate layer 312 in contact with the area. In some embodiments, the rougher the upper surface 313 of the organic layer 269, the thicker the thickness of the intermediate layer 312.

The organic layer 269 of the first light-emitting unit 260 include a first material, the second electrodes 216 of the first light-emitting unit 260 and the second light-emitting unit 270 include an electrode material, and the intermediate layer 312 of the first light-emitting unit 260 includes the first material and the electrode material. In some embodiments, the concentration of the electrode material in the intermediate layer 312 decreases from the second electrode 216 toward the organic layer 269 of the first light-emitting unit 260. In some embodiments, formation of the intermediate layer 312 includes diffusing the electrode material of the second electrode 216 into the organic layer 269 of the first light-emitting unit 260.

In some embodiments, the intermediate layer 312 of the first light-emitting unit 260 further includes a third material. The third material is a reactant from the first material and the electrode material, or is formed by chelation of the first material and the electrode material. In some embodiments, the intermediate layer 312 of the first light-emitting unit 260 includes a central region and a peripheral region surrounding the central region. An amount of the third material of the central region of the intermediate layer 312 is greater than an amount of the third material of the peripheral region of the intermediate layer 312 of the first light-emitting unit 260.

As seen from a cross-sectional view, two opposite ends of the intermediate layer 312 of the first light-emitting unit 260 meet the organic layer 269 and the second electrode 216 at a first meeting point T11 and a second meeting point T12, respectively. In some embodiments, the distance between the first meeting point T11 and the substrate 100 is different from the distance between the second meeting point T12 and the substrate 100.

In some embodiments, each of the bumps 210 has a curved surface protruding away from the substrate 100 and covering a peripheral region of the first electrode 215. The first light-emitting unit 260 overlaps the bumps 210 on two opposite sides of the first light-emitting unit 260, wherein a first overlap width and a second overlap width of the two opposite sides of the first light-emitting unit 260 on the bump 210 measured along an axis are substantially equal, and the distance between the first meeting point T11 and the substrate 100 may be similar to the distance between the second meeting point T12 and the substrate 100. The second light-emitting unit 270 overlaps the bump 210 on a side of the second light-emitting unit 270, and a third overlap width of the second light-emitting unit 270 on the bump 210 measured along the X axis is different from the first overlap width and the second overlap width of the first light-emitting unit 260. In some embodiments, the arrangement of the first light-emitting unit 260 and the second light-emitting unit 270 are as described above or as shown in FIG. 4A. In some embodiments, a difference between the first overlap width and the third overlap width is equal to about 0.1% to about 60% of a width of the first light-emitting unit 260.

In some embodiments, the second light-emitting unit 270 further includes an intermediate layer 322 between the organic layer 279 and the second electrode 216. The organic layer 279 of the second light-emitting unit 270 includes a second material, and the intermediate layer 322 of the second light-emitting unit 270 includes the second material and the electrode material. In some embodiments, an amount of the electrode material of the intermediate layer 322 of the second light-emitting unit 270 is less than an amount of the electrode material of the intermediate layer 312 of the first light-emitting unit 260.

In some embodiments, the intermediate layer 322 of the second light-emitting unit 270 further includes a fourth material. The fourth material is a reactant from the second material and the electrode material, or is formed by chelation of the second material and the electrode material. The intermediate layer 322 of the second light-emitting unit 270 may include a central region and a peripheral region surrounding the central region. An amount of the fourth material of the central region of the intermediate layer 322 is greater than an amount of the fourth material of the peripheral region of the intermediate layer 322.

In some embodiments, a ratio of a thickness of the intermediate layer 322 of the second light-emitting unit 270 to a thickness of the intermediate layer 312 of the first light-emitting unit 260 is between 0.001 and 0.2. The thicknesses of the organic layers 269, 279 may be related to the thicknesses of the intermediate layers 312, 322. In some embodiments, the thickness of the organic layer 269 of the first light-emitting unit 260 is less than the thickness of the organic layer 279 of the second light-emitting unit 270, and the thickness of the intermediate layer 312 of the first light-emitting unit 260 is greater than the thickness of the intermediate layer 322 of the second light-emitting unit 270.

In some embodiments, a thickness uniformity of the intermediate layer 312 of the first light-emitting unit 260 is greater than a thickness uniformity of the intermediate layer 322 of the second light-emitting unit 270. The thickness uniformity of the intermediate layer 312, 322 may be related to the diffusion of electrode material of the second electrode 216. In some embodiments, the greater the thickness uniformity of the organic layer 269, 279, the greater the degree of diffusion of the electrode material, that is, the thicker the thickness of the intermediate layer 312, 322. In some embodiments, the thickness uniformity of the intermediate layer 312 of the first light-emitting unit 260 is greater than the thickness uniformity of the intermediate layer 322 of the second light-emitting unit 270, and the thickness of the intermediate layer 312 of the first light-emitting unit 260 is greater than the thickness of the intermediate layer 322 of the second light-emitting unit 270

In some embodiments, the second electrode 216 is segmented into several pieces, and each piece is disposed in one light-emitting unit. In some embodiments, the first and second light-emitting units 260, 270 share a common second electrode 216.

Figure 12:
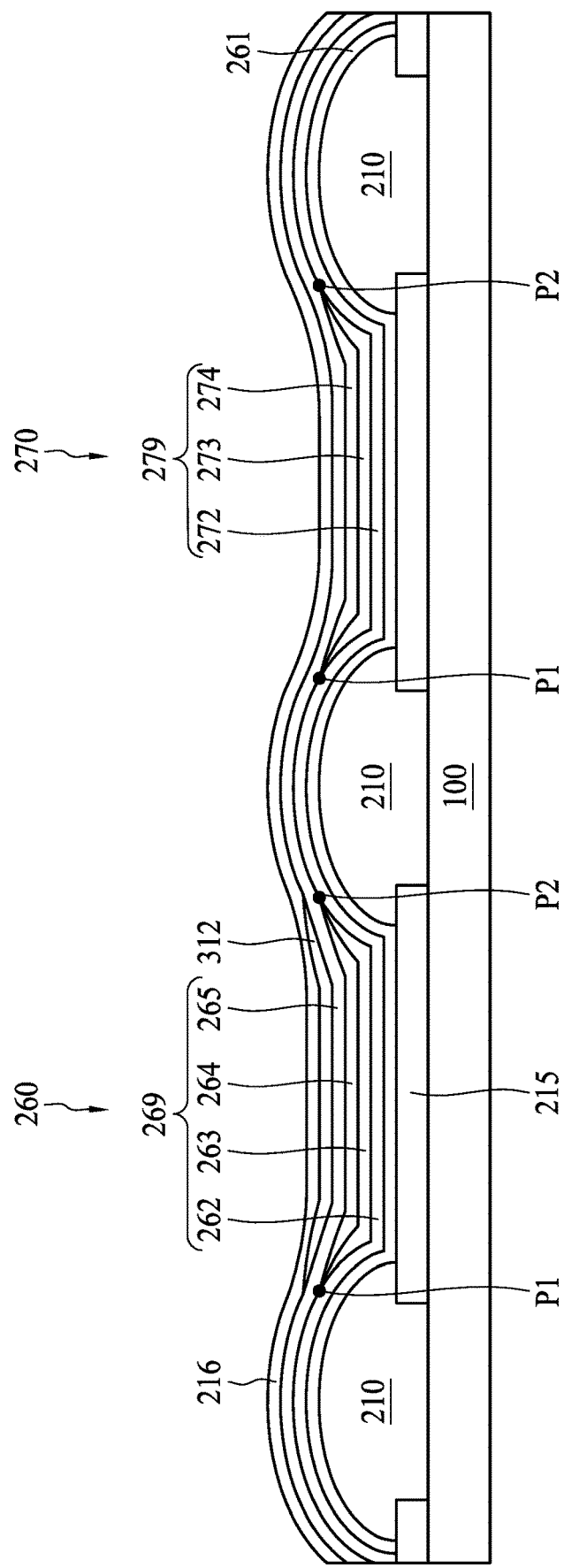
FIG. 12 is a cross-sectional view of a light-emitting device, according to an embodiment.

FIG. 12 is a cross-sectional view of the light-emitting device illustrating another embodiment of the present invention. In some embodiments, each of the organic layers 269, 279 further includes a first carrier transportation layer 262, 272 between the organic emissive layer 264, 274 and the first electrode 215. In some embodiments, the thickness of the first carrier transportation layer 262 of the first light-emitting unit 260 is greater than the thickness of the first carrier transportation layer 272 of the second light-emitting unit 270. In some embodiments, a thickness uniformity of the first carrier transportation layer 262 of the first light-emitting unit 260 is less than a thickness uniformity of the first carrier transportation layer 272 of the second light-emitting unit 270. In some embodiments, the second carrier transportation layer 272 is a second hole transportation layer.

In some embodiments, the thickness of the second carrier transportation layer 263 of the first light-emitting unit 260 is different from the thickness of the second carrier transportation layer 273 of the second light-emitting unit 270. In some embodiments, the total thickness of the first carrier transportation layer 262 and the second carrier transportation layer 263 of the first light-emitting unit 260 and the total thickness of the first carrier transportation layer 272 and the second carrier transportation layer 273 of the second light-emitting unit 270 are substantially equal. In some embodiments, the thickness of the first carrier transportation layer 262 of the first light-emitting unit 260 is greater than the thickness of the first carrier transportation layer 272 of the second light-emitting unit 270, and the thickness of the second carrier transportation layer 263 of the first light-emitting unit 260 is less than the thickness of the second carrier transportation layer 273 of the second light-emitting unit 270.

The first and second light-emitting units 260, 270 may have an organic carrier transportation layer 265 over the organic emissive layer 264 of the first and second light-emitting units 260, 270 and over the intermediate layer 312 of the first light-emitting unit 260. In some embodiments, the first and second light-emitting units 260, 270 share a common organic carrier transportation layer 265. The organic carrier transportation layer 265 is over the bumps 210 and the organic emissive layer 264 of the first and second light-emitting units 260, 270. In some embodiments, the second electrode 216 is disposed over the intermediate layer 312 and the exposed portion of the organic carrier transportation layer 265.

In some embodiments, the light-emitting device further includes a carrier injection layer 261 (which is a same type as the first carrier transportation layer 262) disposed over and continuously covering the bumps 210 and the first electrode 215. The organic emissive layers 264 of the first light-emitting unit 260 may be disposed between the second carrier transportation layer 263 and the corresponding organic carrier transportation layer 265. The organic carrier transportation layer 265 of the first and second light-emitting units 260, 270 may be an electron transportation layer. Similarity, the organic emissive layers 274 of the second light-emitting unit 270 may be disposed between the second carrier transportation layer 273 and the corresponding organic carrier transportation layer 265.

Each of the first and second light-emitting units 260, 270 includes a point P1 and a point P2. Each of point P1 and point P2 represents a position where one end of the second carrier transportation layer 263, 273 meets the corresponding organic emissive layer 264, 274 and the first carrier transportation layer 262, 272. In some embodiments, each of the first and second light-emitting units 260, 270 includes point P1 and point P2 located at two opposite ends of the second carrier transportation layer 263, 273 as seen from a cross-sectional view. Point P1 and point P2 are located at two opposite ends of the organic emissive layer 264, 274.

A vertical distance between point P1 and the substrate 100 of the first light-emitting unit 260 may be similar to or different from a vertical distance between point P1 and the substrate 100 of the second light-emitting unit 270. Similarity, a vertical distance between point P2 and the substrate 100 of the first light-emitting unit 260 may be similar to or different from a vertical distance between point P2 and the substrate 100 of the second light-emitting unit 270. A distance between point P1 and point P2 of the first light-emitting unit 260 may be similar to or different from a distance between point P1 and point P2 of the second light-emitting unit 270.

In some embodiments, when the first color is green and the second color is red or blue, or when the first color is red and the second color is blue, the first carrier transportation layer 262 of the first light-emitting unit 260 is thinner than the first carrier transportation layer 272 of the second light-emitting unit 270.

Figure 13:
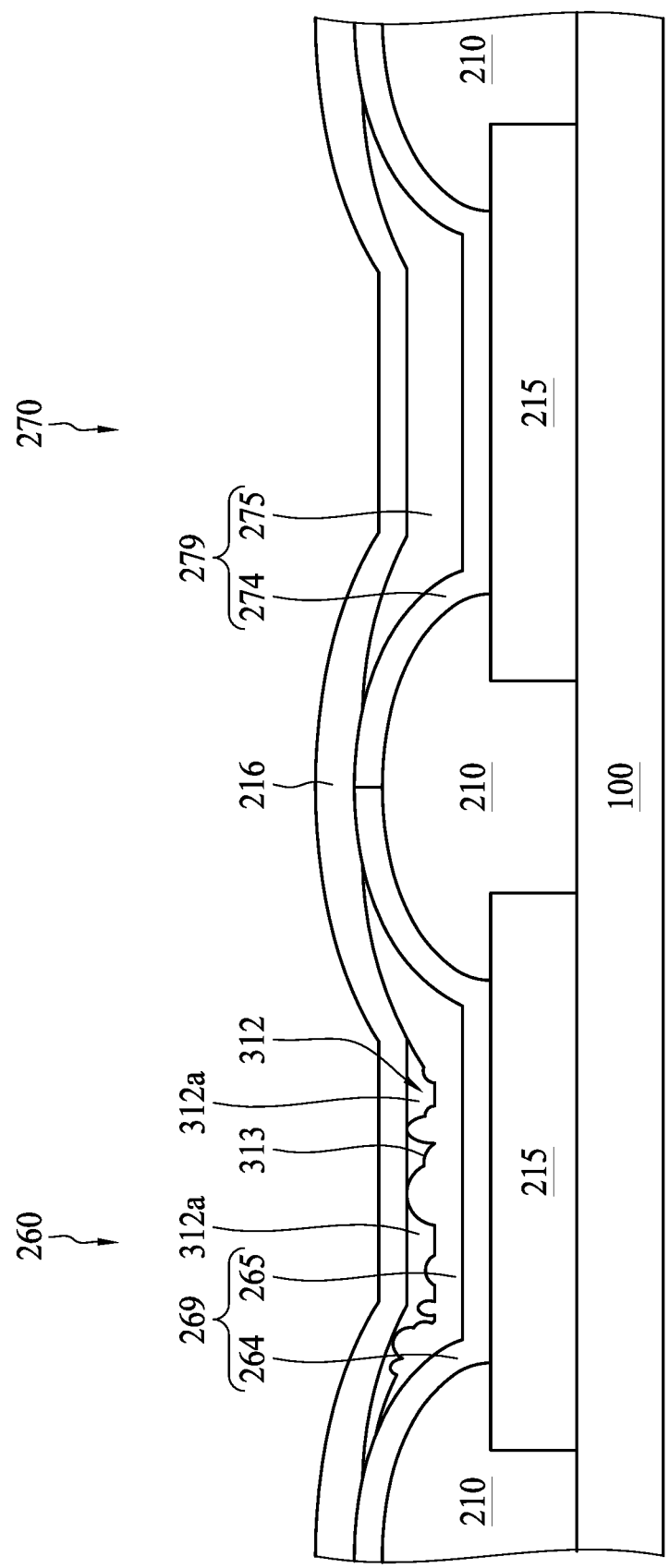
FIG. 13 is a cross-sectional view of a light-emitting device, according to an embodiment.

FIG. 13 is a cross-sectional view of the light-emitting device illustrating another embodiment of the present invention. In some embodiments, an intermediate layer 312 of the first light-emitting unit 260 includes several discontinuous segments 312a, wherein each of the segments 312a is disposed in the first light-emitting unit 260. Shapes and sizes of the segments 312a can be the same or different depending on the actual demand.

The segments 312a are disposed on the upper surface 313. In some embodiments, the upper surface 313 includes many areas of varying roughness, and the segments 312a are formed on the relatively rough areas of the upper surface 313. In some embodiments, the upper surface 313 of the formerly-formed organic layer 269 of the first light-emitting unit 260 may include recess, such as a V-shape recess, and the segments 312a are disposed in the recess.

In some embodiments, an intermediate layer 322 of the second light-emitting unit 270 includes a plurality of discontinuous segments (not shown). Shapes and sizes of the segments of the intermediate layer 322 can be the same or different depending on the actual demand. In some embodiments, the number of the segments of the intermediate layer 322 of the second light-emitting unit 270 is less than the number of the segments 312a of the intermediate layer 312 of the first light-emitting unit 260. In some embodiments, the size of the segments of the intermediate layer 322 of the second light-emitting unit 270 is less than the size of the segments 312a of the intermediate layer 312 of the first light-emitting unit 260.

Figure 14:
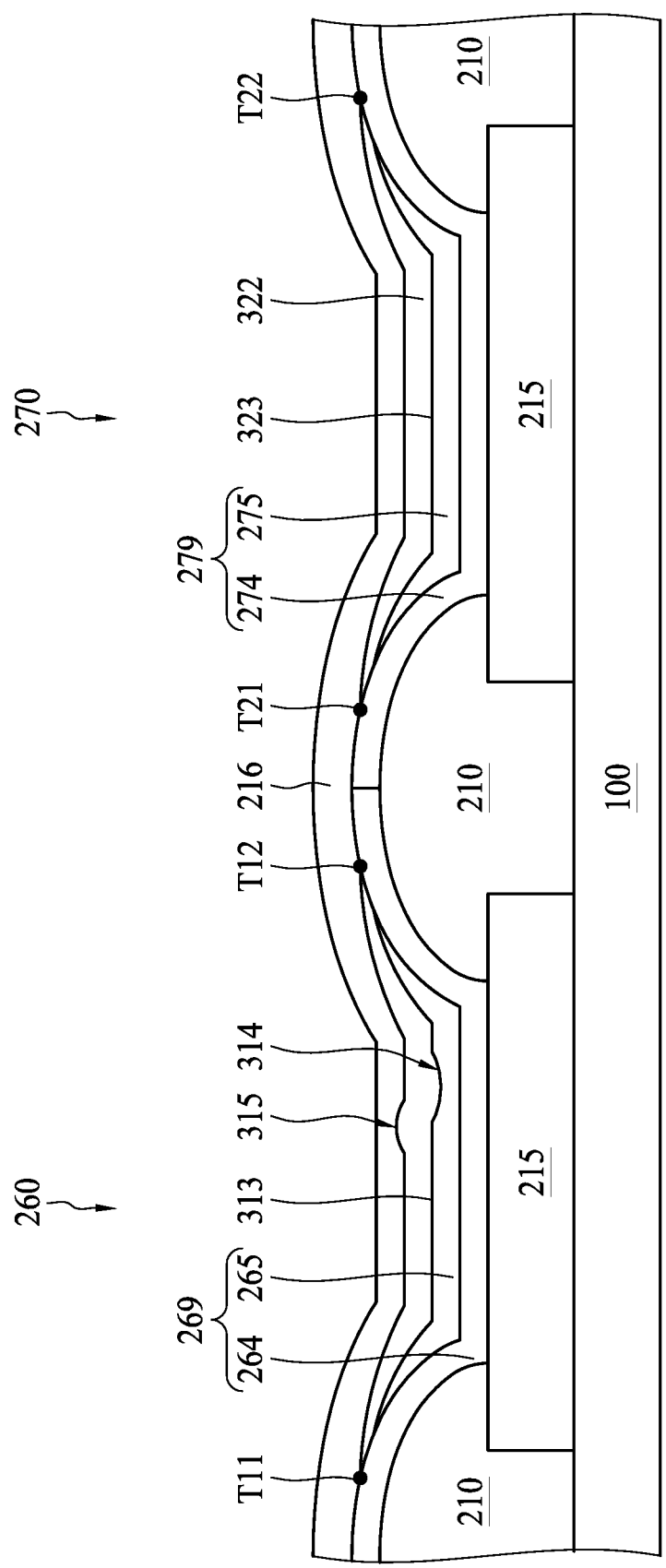
FIG. 14 is a cross-sectional view of a light-emitting device, according to an embodiment.

FIG. 14 is a cross-sectional view of the light-emitting device illustrating another embodiment of the present invention. In some embodiments, the organic layer 269 of the first light-emitting unit 260 includes a top surface 313 of the organic layer 269 and a recess 314 formed in the top surface 313. The intermediate layer 312 of the first light-emitting unit 260 is disposed in the recess 314. In some embodiments, the intermediate layer 312 of the first light-emitting unit 260 further covers a portion of the top surface 313 of the organic layer 269 of the first light-emitting unit 260. In some embodiments, several recesses 314 are formed in the top surface 313. The shape and the size of each recess 314 can be the same or different depending on the actual demand.

In some embodiments, a top surface of the intermediate layer 312 of the first light-emitting unit 260 includes a protrusion 315. The protrusion 315 may protrude into the second electrode 216. In some embodiments, a top surface of the intermediate layer 312 of the first light-emitting unit 260 includes several protrusions 315.

In some embodiments, the intermediate layer 322 of the second light-emitting unit 270 includes a top surface 323. In contrast to the top surface 323 of the intermediate layer 322 of the second light-emitting unit 270, the top surface 313 of the intermediate layer 312 of the first light-emitting unit 260 may be rough. In some embodiments, in contrast to the top surface 323 of the intermediate layer 322 of the second light-emitting unit 270, the top surface 313 of the intermediate layer 312 of the first light-emitting unit 260 is undulating.

Figure 15:
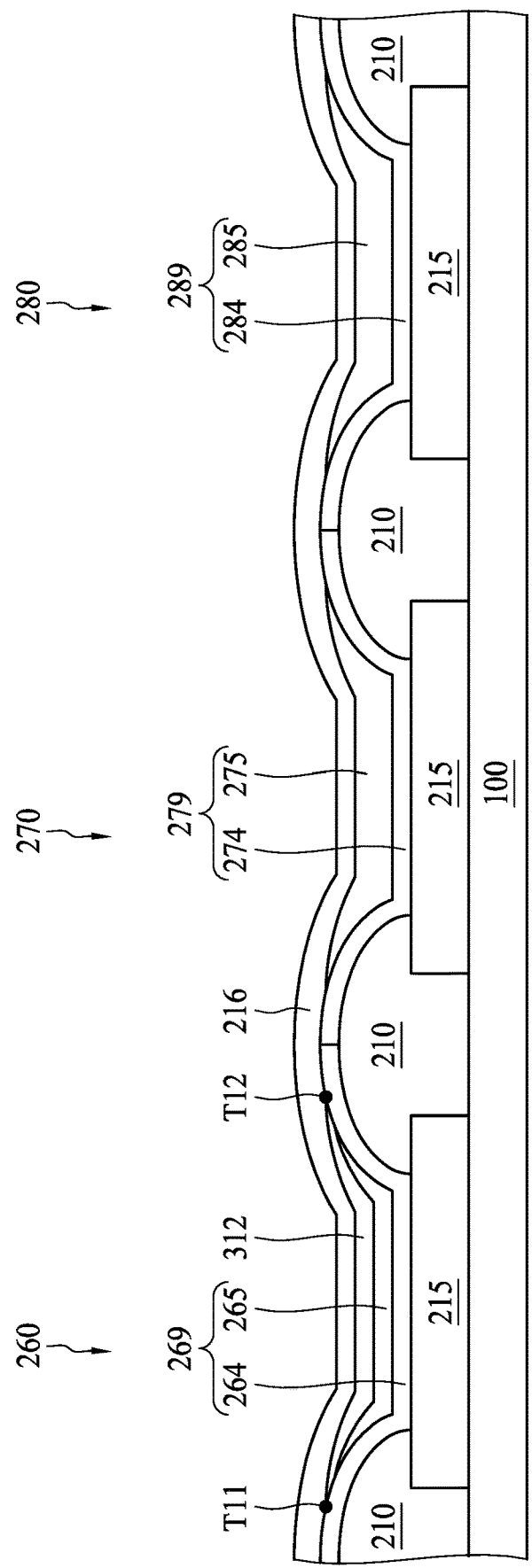
FIG. 15 is a cross-sectional view of a light-emitting device, according to an embodiment.

FIG. 15 is a cross-sectional view of the light-emitting device illustrating another embodiment of the present invention. In some embodiments, the light-emitting device further includes a third light-emitting unit 280. Although the second and third light-emitting units 270, 280 are illustrated in FIG. 15 as having similar features, this is intended to be illustrative only and is not intended to limit the embodiments. The second and third light-emitting units 270, 280 may have similar structures or different structures in order to meet the desired functional capabilities. The first, second and third light-emitting units 260, 270, 280 may differ from each other in at least the thicknesses of the organic layers 269, 279, 289. In some embodiments, the first light-emitting unit 260 emits green light, the second light-emitting unit 270 emits red light, and the third light-emitting unit 280 emits blue light.

In some embodiments, the light-emitting units 260, 270, 280 are configured to be divided into at least three different groups, wherein each group emits a color different from the colors emitted by the other groups. A thickness of each organic layer 269, 279, 289 may be related to the color displayed by the corresponding light-emitting units 260, 270, 280. In some embodiments, the first light-emitting unit 260 emits green light, compared to the other light-emitting units configured to emit different colors, and the organic layers 269 of the first light-emitting unit 260 may have the least thickness. In some embodiments, the second light-emitting unit 270 emits red light, compared to the other light-emitting units configured to emit different colors, and the thickness of the organic layers 279 of the second light-emitting unit 270 may be between the thickness of the organic layers 269 of the first light-emitting unit 260 and the thickness of the organic layers 289 of the third light-emitting unit 280. In some embodiments, the third light-emitting unit 280 emits blue light, compared to the other light-emitting units configured to emit different colors, and the organic layers 289 of the third light-emitting unit 280 may have the greatest thickness.

In some embodiments, the third light-emitting unit 280 further includes an intermediate layer (not shown) between the organic layer 289 and the second electrode 216. The thickness of the organic layer 289 of the third light-emitting unit 280 is less than the thickness of the intermediate layer 312 of the first light-emitting layer 260. In some embodiments, the thickness of the organic layer 289 of the third light-emitting unit 280 is less than the thickness of the intermediate layer 322 of the second light-emitting layer 270.

In some embodiments, the first, second and third light-emitting units 260, 270, 280 may differ from each other at least in differences in the thicknesses of the first carrier transportation layers 262 of the first, second and third light-emitting units 260, 270, 280.

In some embodiments, the light-emitting units 260, 270, 280 are configured to be divided into at least three different groups, wherein each group emits a color different from the colors emitted by the other groups. A thickness of the first carrier transportation layer 262 may be related to the color displayed by the corresponding light-emitting unit 260. In some embodiments, the first light-emitting unit 260 emits green light, compared to the other light-emitting units configured to emit different colors, and the first carrier transportation layer 262 of the first light-emitting unit 260 may have the least thickness. In some embodiments, the second light-emitting unit 270 emits red light, compared to the other light-emitting units configured to emit different colors, and the thickness of the first carrier transportation layer 272 of the second light-emitting unit 270 may be between the thickness of the first carrier transportation layer 262 of the first light-emitting unit 260 and the thickness of the first carrier transportation layer 282 of the third light-emitting unit 280. In some embodiments, the third light-emitting unit 280 emits blue light, compared to the other light-emitting units configured to emit different colors, and the first carrier transportation layer of the third light-emitting unit 280 may have the greatest thickness.

The foregoing outlines features of several embodiments so that those skilled in the art may better understand the aspects of the present disclosure. Those skilled in the art should appreciate that they may readily use the present disclosure as a basis for designing or modifying other processes and structures for caring out the same purposes and/or achieving the same advantages as the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light-emitting device, comprising:
a substrate;
a plurality of bumps over the substrate; and
a plurality of light-emitting units separated by the plurality of bumps, the plurality of light-emitting units each including a first electrode on the substrate, an organic layer on the first electrode, and a second electrode on the organic layer, the plurality of light-emitting units comprising a first light-emitting unit and a second light-emitting unit, and the first light-emitting unit further including an intermediate layer between the organic layer and the second electrode;
wherein the organic layer of the first light-emitting unit includes a first material, the second electrodes of the first light-emitting unit and the second light-emitting unit include an electrode material, and the intermediate layer of the first light-emitting unit includes the first material and the electrode material.

2. The light-emitting device of claim 1, wherein the first light-emitting unit emits green light or red light.

3. The light-emitting device of claim 1, wherein a concentration of the electrode material in the intermediate layer decreases from the second electrode toward the organic layer of the first light-emitting unit.

4. The light-emitting device of claim 1, wherein each of the organic layers includes a light-emitting layer on the first electrode and an electron transportation layer disposed over the light-emitting layer.

5. The light-emitting device of claim 1, wherein the intermediate layer of the first light-emitting unit includes a third material, and the third material is a reactant from the first material and the electrode material, or is formed by chelation of the first material and the electrode material.

6. The light-emitting device of claim 1, wherein each of the plurality of bumps has a curved surface protruding away from the substrate and covers a peripheral region of the first electrode, the first light-emitting unit overlaps the plurality of bumps on two opposite sides of the first light-emitting unit, and a first overlap width and a second overlap width of the two opposite sides of the first light-emitting unit on the plurality of bumps measured along an axis are substantially equal; the second light-emitting unit overlaps a bump on a side of the second light-emitting unit, and a third overlap width of the second light-emitting unit on the bump measured along the axis is different from the first overlap width and the second overlap width of the first light-emitting unit; and a difference of the first overlap width and the third overlap width is equal to about 0.1% to about 60% of a width of the first light-emitting unit.

7. The light-emitting device of claim 1, wherein the intermediate layer includes a plurality of discontinuous segments.

8. The light-emitting device of claim 1, wherein the organic layer of the first light-emitting unit includes a top surface and a recess formed on the top surface, and the intermediate layer of the first light-emitting unit is disposed in the recess.

9. The light-emitting device of claim 8, wherein the intermediate layer of the first light-emitting unit further covers a portion of the top surface of the organic layer of the first light-emitting unit.

10. The light-emitting device of claim 8, wherein a top surface of the intermediate layer of the first light-emitting unit includes a protrusion.

11. The light-emitting device of claim 1, wherein the second light-emitting unit further includes an intermediate layer between the organic layer and the second electrode, wherein the organic layer of the second light-emitting unit includes a second material, and the intermediate layer of the second light-emitting unit includes the second material and the electrode material.

12. The light-emitting device of claim 11, wherein a ratio of a thickness of the intermediate layer of the second light-emitting unit to a thickness of the intermediate layer of the first light-emitting unit is between 0.001 and 0.2.

13. The light-emitting device of claim 11, wherein an amount of the electrode material of the intermediate layer of the second light-emitting unit is less than an amount of the electrode material of the intermediate layer of the first light-emitting unit.

14. A light-emitting device, comprising:
a substrate;
a plurality of bumps over the substrate; and
a first light-emitting unit and a second light-emitting unit between the bumps and over the substrate and separated by one of the bumps, wherein each of the first and second light-emitting units includes a first electrode, an organic layer over the first electrode and a second electrode over the organic layer;
wherein a thickness of the organic layer of the first light-emitting unit is less than a thickness of the organic layer of the second light-emitting unit, a wavelength of a light emitted from the first light-emitting unit is greater than a wavelength of a light emitted from the second light-emitting unit, and a thickness uniformity of the organic layer of the first light-emitting unit is greater than a thickness uniformity of the organic layer of the second light-emitting unit.

15. The light-emitting device of claim 14, wherein the thickness of the organic layer of the first light-emitting unit is equal to about 20% to about 80% of the thickness of the organic layer of the second light-emitting unit.

16. The light-emitting device of claim 14, wherein each of the plurality of bumps has a curved surface protruding away from the substrate and covering a peripheral region of the first electrode, the first light-emitting unit overlaps the plurality of bumps on two opposite sides of the first light-emitting unit, and a first overlap width and a second overlap width of the two opposite sides of the first light-emitting unit on the plurality of bumps measured along an axis are substantially equal; the second light-emitting unit overlaps a bump on a side of the second light-emitting unit, and a third overlap width of the second light-emitting unit on the bump measured along the axis is different from the first overlap width and the second overlap width of the first light-emitting unit; and a difference between the first overlap width and the third overlap width is equal to about 0.1% to about 60% of a width of the first light-emitting unit.

\* \* \* \* \*